(12) United States Patent
Yoo et al.

(10) Patent No.: US 11,847,285 B2
(45) Date of Patent: Dec. 19, 2023

(54) DISPLAY DEVICE AND POSITION INPUT SYSTEM INCLUDING THE SAME

(71) Applicant: SAMSUNG DISPLAY CO., LTD., Yongin-si (KR)

(72) Inventors: Gi Na Yoo, Cheonan-si (KR); Ju Yeon Kim, Asan-si (KR); Won Sang Park, Yongin-si (KR); Chang Woo Shim, Cheonan-si (KR); Seong Jun Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/056,370

(22) Filed: Nov. 17, 2022

(65) Prior Publication Data
US 2023/0280871 A1    Sep. 7, 2023

(30) Foreign Application Priority Data
Mar. 2, 2022    (KR) .......................... 10-2022-0026601

(51) Int. Cl.
*G06F 3/041*    (2006.01)
*G06F 3/044*    (2006.01)
*H10K 59/12*    (2023.01)

(52) U.S. Cl.
CPC .......... *G06F 3/0446* (2019.05); *G06F 3/0412* (2013.01); *G06F 3/0448* (2019.05); *G06F 2203/04112* (2013.01); *H10K 59/12* (2023.02)

(58) Field of Classification Search
CPC .... G06F 3/0446; G06F 3/0448; G06F 3/0412; G06F 2203/04112; H10K 59/12
See application file for complete search history.

(56) References Cited

U.S. PATENT DOCUMENTS

2017/0153763 A1*  6/2017  Vavra ................... G06F 3/0442
2023/0023671 A1   1/2023  Shim et al.

FOREIGN PATENT DOCUMENTS

| EP | 4124936 | 1/2023 |
|---|---|---|
| KR | 10-2012-0110817 | 10/2012 |
| KR | 10-2017-0109184 | 9/2017 |
| KR | 10-2019-0096472 | 8/2019 |
| KR | 10-2001152 | 10/2019 |
| KR | 10-2023-0016737 | 2/2023 |

\* cited by examiner

*Primary Examiner* — Deeprose Subedi
(74) *Attorney, Agent, or Firm* — F. Chau & Associates, LLC

(57) ABSTRACT

A display device includes a pixel having a plurality of emission areas, a plurality of touch electrodes disposed between the plurality of emission areas to sense a touch, a plurality of position code patterns covering a partial front surface of at least one of the plurality of touch electrodes in a preset code shape, and a light blocking pattern disposed on front surfaces of the plurality of touch electrodes on which the plurality of position code patterns are not formed. A width or size of the plurality of position code patterns is greater than a width or size of the light blocking pattern.

23 Claims, 21 Drawing Sheets

DISPLAY DEVICE AND POSITION INPUT SYSTEM INCLUDING THE SAME

CROSS-REFERENCE TO RELATED APPLICATION

This U.S. non-provisional patent application claims priority under 35 U.S.C. § 119 to Korean Patent Application No. 10-2022-0026601 filed on Mar. 02, 2022 in the Korean Intellectual Property Office, the disclosure of which is incorporated by reference in its entirety herein.

1. Technical Field

The present disclosure relates to a display device and a position input system including the same.

2. Discussion of the Related Art

Display devices are used for displaying images. For example, display devices are employed in various electronic devices such as smartphones, digital cameras, laptop computers, navigation devices, and smart televisions. A display device may be a flat panel display device such as a liquid crystal display device, a field emission display device and an organic light emitting display device. Since each pixel in a display panel of a light emitting display device includes a light emitting element capable of emitting light by itself, an image can be displayed without a backlight unit providing light to the display panel.

A recent display device supports a touch input using a user's body part (e.g., a finger) or an electronic pen.

SUMMARY

Aspects of the present disclosure provide a display device capable of determining position coordinates of a position input device such as an electronic pen or the like using position code patterns of a display panel, and a position input system including the same.

Aspects of the present disclosure also provide a display device capable of increasing the recognition rate of position code patterns by adjusting the pattern width and pattern shape of the position code patterns, and a touch input system including the same.

According to an embodiment of the disclosure, a display device includes a pixel having a plurality of emission areas, a plurality of touch electrodes disposed between the plurality of emission areas to sense a touch, a plurality of position code patterns covering a partial front surface of at least one of the plurality of touch electrodes in a preset code shape, and a light blocking pattern disposed on front surfaces of the plurality of touch electrodes on which the plurality of position code patterns are not formed. A width or size of the plurality of position code patterns is greater than a width or size of the light blocking pattern.

In an embodiment, the plurality of emission areas are arranged in a horizontal or vertical stripe structure or are arranged in a pentile™ matrix structure, the plurality of touch electrodes include a plurality of driving electrodes, a plurality of sensing electrodes, and a plurality of dummy electrodes, and the plurality of driving electrodes, the plurality of sensing electrodes, and the plurality of dummy electrodes are formed in a mesh structure surrounding spaces between all the plurality of emission areas and outer sides thereof.

In an embodiment, the plurality of position code patterns and the light blocking pattern include a black pigment that absorbs infrared or ultraviolet rays, and are formed by patterning to partially cover a front surface and a side surface of at least one of the plurality of touch electrodes so as not to overlap each other.

In an embodiment, the light blocking pattern is formed in a mesh shape surrounding spaces between the plurality of emission areas and outer sides thereof according to an arrangement shape of the plurality of touch electrodes, and is formed to have a width corresponding to a width of the front surfaces of the plurality of touch electrodes.

In an embodiment, front sides of the plurality of position code patterns have inclined surfaces.

In an embodiment, a width or size in at least one of X-axis and Y-axis directions and first to fourth directions of the plurality of position code patterns is greater than a width or size in the X-axis and Y-axis directions and the first to fourth directions of the light blocking pattern, the X-axis and Y-axis directions are vertical and horizontal directions, and the first to fourth directions are diagonal directions with respect to the X-axis and Y-axis directions.

In an embodiment, a planar code pattern shape of each of the plurality of position code patterns has a polygonal pattern shape of at least one of a rectangular shape, a square shape, a circular shape, a semicircular shape, a fan shape, or a rhombus shape, or has a pattern shape in which a plurality of polygonal pattern shapes are combined.

In an embodiment, a planar code pattern shape of each of the plurality of position code patterns has a polygonal closed loop pattern shape of at least one of a rectangular pattern, a square pattern, a rhombus pattern, a pentagonal pattern, or a hexagonal pattern surrounding at least one of the plurality of emission areas.

In an embodiment, a planar code pattern shape of each of the plurality of position code patterns has a planar mesh pattern shape surrounding spaces between the plurality of emission areas formed in a position code forming area and outer sides thereof, covers a part of at least one adjacent emission area, and covers front and side surfaces of the plurality of touch electrodes.

In an embodiment, the plurality of position code patterns has at least one of a fan-shaped pattern shape, a semicircular pattern shape, or a circular pattern shape between a plurality of emission areas adjacent to each other in a position code forming area, or are has a pattern shape in which the fan-shaped pattern shape, the semicircular pattern shape, and the circular pattern shape are in contact with each other and combined.

In an embodiment, a planar code pattern shape of each of the plurality of position code patterns has an open loop shape partially surrounding outer sides of at least one emission area located in a position code forming area.

In an embodiment, the plurality of position code patterns have at least one pattern shape selected among a straight or curved shape of a preset length, a cross pattern shape, and an irregular polygonal pattern shape having a predetermined curvature, between a plurality of emission areas adjacent to each other formed in a position code forming area.

In an embodiment, an area of each of the plurality of position code patterns, a width in at least one direction thereof, a length in at least one direction thereof, and a size in at least one direction thereof are different from those of other adjacent position code patterns.

According to an embodiment of the disclosure, a position input system includes a display device configured to display an image, and a position input device configured to input position coordinate data to the display device. The display device includes a pixel having a plurality of emission areas, a plurality of touch electrodes disposed between the plurality of emission areas to sense a touch, a plurality of position code patterns covering a partial front surface of at least one of the plurality of touch electrodes in a preset code shape, and a light blocking pattern disposed on front surfaces of the plurality of touch electrodes on which the plurality of position code patterns are not formed. A width or size of the plurality of position code patterns is greater than a width or size of the light blocking pattern.

In an embodiment, the position input device includes a code detector configured to detect the plurality of position code patterns, a code processor configured to receive shape data for the plurality of position code patterns, extract a data code corresponding to a shape of the plurality of position code patterns, and generate the position coordinate data corresponding to the data code, and a communication module configured to transmit the position coordinate data to the display device.

In an embodiment, the plurality of emission areas are arranged in a horizontal or vertical stripe structure, or are arranged in a pentile™ matrix structure, the plurality of touch electrodes comprise a plurality of driving electrodes, a plurality of sensing electrodes, and a plurality of dummy electrodes, and the plurality of driving electrodes, the plurality of sensing electrodes, and the plurality of dummy electrodes are formed in a mesh structure surrounding spaces between all the plurality of emission areas and outer sides thereof.

In an embodiment, the plurality of position code patterns and the light blocking pattern include a black pigment that absorbs infrared or ultraviolet rays, and are formed by patterning to partially cover a front surface and a side surface of at least one of the plurality of touch electrodes so as not to overlap each other.

In an embodiment, the light blocking pattern has a mesh shape surrounding spaces between the plurality of emission areas and outer sides thereof according to an arrangement shape of the plurality of touch electrodes, and has a width corresponding to a width of the front surfaces of the plurality of touch electrodes.

In an embodiment, front sides of the plurality of position code patterns have included surfaces.

In an embodiment, a width or size in at least one of X-axis and Y-axis directions and first to fourth directions of the plurality of position code patterns is greater than a width or size in the X-axis and Y-axis directions and the first to fourth directions of the light blocking pattern, the X-axis and Y-axis directions are vertical and horizontal directions, and the first to fourth directions are diagonal directions with respect to the X-axis and Y-axis directions.

According to an embodiment of the disclosure, a display device includes a pixel having a plurality of emission areas; a plurality of touch electrodes disposed between the plurality of emission areas to sense a touch; a plurality of position code patterns covering part of a first surface of at least one of the plurality of touch electrodes, where the position code patterns have different shapes from one another; and a light blocking pattern disposed on a second other surface of the plurality of touch electrodes. Each of the plurality of position code patterns is larger than the light blocking pattern.

The plurality of emission areas may be arranged in a stripe structure or in a pentile™ matrix structure. The plurality of position code patterns and the light blocking pattern may include a black pigment that absorbs infrared or ultraviolet rays.

In accordance with the display device and the position input system including the same according to the embodiments, it is possible to generate the position coordinate data of the position input device such as an electronic pen or the like using the position code patterns of the display panel without complicated calculation and correction, and also possible to input the position coordinates of the position input device. In particular, it is possible to perform a position input function based on accurate input coordinates, thereby reducing a cost and power consumption and simplifying a driving process.

Further, in accordance with the display device and the position input system including the same according to the embodiments, it is possible to increase the recognition rate of the position code patterns by adjusting the pattern width and pattern shape of the position code patterns.

However, the effects of the present disclosure are not limited to the aforementioned effects, and various other effects may be provided by embodiments of the present disclosure.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF THE EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

Hereinafter, illustrative embodiments will be described in detail with reference to the accompanying drawings.

Figure 1:
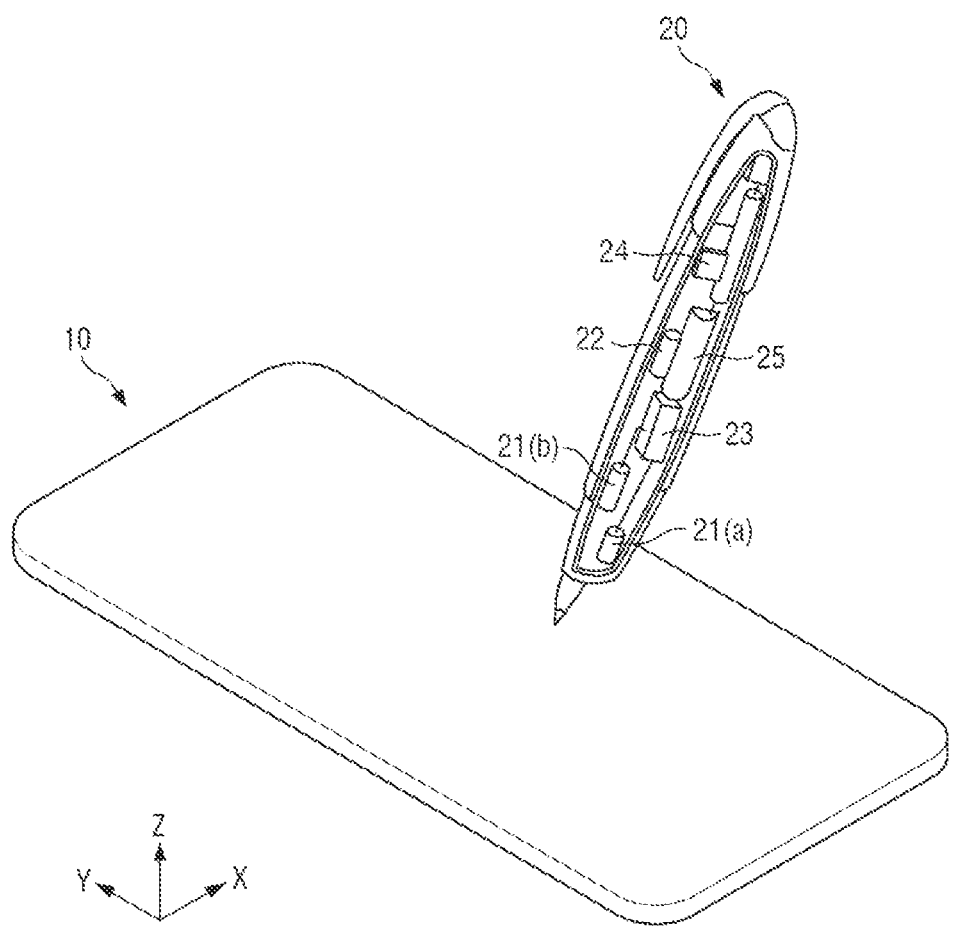
FIG. 1 is a block diagram showing a position input system according to an embodiment of the present disclosure.
Figure 2:
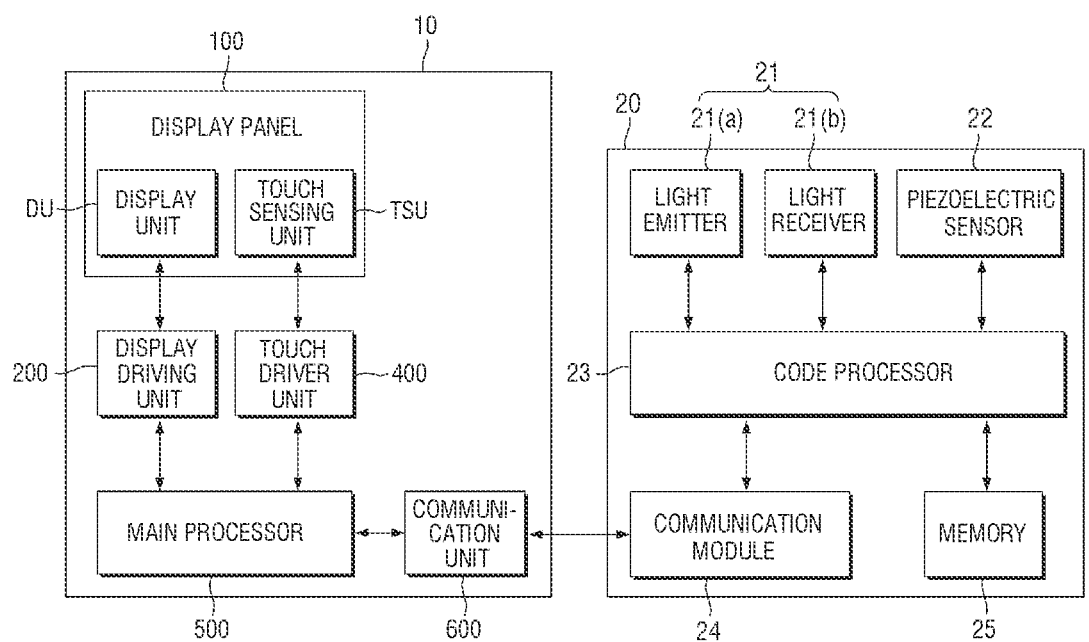
FIG. 2 is a block diagram illustrating a display device and a position input device shown in FIG. 1.

FIG. 1 is a block diagram showing a position input system according to an embodiment of the present disclosure. FIG. 2 is a block diagram illustrating a display device and a position input device shown in FIG. 1.

Referring to FIGS. 1 and 2, the display device 10 may be applied to portable electronic devices such as a mobile phone, a smartphone, a tablet personal computer, a mobile communication terminal, an electronic organizer, an electronic book, a portable multimedia player (PMP), a navigation system, an ultra mobile PC (UMPC) or the like. Alternatively, the display device 10 may be applied as a display unit of a television, a laptop, a monitor, a billboard, or an Internet-of-Things (IoT) device. In another example, the display device 10 may be applied to wearable devices such as a smart watch, a watch phone, a glasses type display, or a head mounted display (HMD).

The display device 10 may be a light emitting display device such as an organic light emitting display device using an organic light emitting diode, a quantum dot light emitting display device including a quantum dot light emitting layer, an inorganic light emitting display device including an inorganic semiconductor, and a micro or nano light emitting display device using a micro or nano light emitting diode (LED). The following description is directed to the case where the display device 10 is an organic light emitting display device, but the present disclosure is not limited thereto.

The display device 10 includes a display panel 100, a display driver 200 (e.g., a driver circuit), a touch driver 400 (e.g., a driver circuit), a main processor 500, and a communication unit 600 (e.g., a communication device/circuit, a transceiver, etc.).

The display device 10 uses a position input device 20 such as an electronic pen or the like as a position coordinate input device. The display panel 100 of the display device 10 may include a display unit DU for displaying an image, and a touch sensing unit TSU (e.g., a touch sensor or touch sensing device) for sensing a touch of a body part, such as a finger, and/or a touch pen.

The display unit DU of the display panel 100 may include a plurality of unit pixels to display an image through the plurality of unit pixels. The touch sensing unit TSU may be mounted and attached to the front surface of the display panel 100. The touch sensing unit TSU may include a plurality of touch electrodes, and may sense a touch of a user's body part and a touch pen on the front surface of the display panel 100 in a capacitive manner. Here, position code patterns are formed on some of the plurality of touch electrodes, so that the position code patterns may be sensed by the position input device 20. One or more sensed position code patterns may be used to determine a position of the display unit DU touched by the position input device 20.

The position code patterns of the display panel 100 are formed of a light blocking member that covers a predetermined area of some of the plurality of touch electrodes to form a preset planar code shape. Accordingly, the position code patterns are sensed by the position input device 20 depending on the shape of the planar code pattern of the light blocking member and the size (or area) of the planar code pattern. For example, a first position code pattern having a first shape and a first size may represent a first position of the display unit DU and a second position code pattern having the same shape but a different second size may represent a second other position of the display unit DU. A light blocking pattern is formed on the front surfaces of the other touch electrodes except partial front surfaces of the touch electrodes on which the position code patterns are formed.

In an embodiment, the position code patterns of a planar code shape are formed at preset intervals on partial front surfaces of preset touch electrodes among the plurality of touch electrodes.

In addition, a light blocking pattern for blocking infrared or ultraviolet light that is not sensible as a position code pattern by the position input device 20 is formed on the front surfaces of the other touch electrodes on which the position code patterns are not formed. The light blocking pattern covers the front surfaces of the touch electrodes to prevent the front surfaces of the touch electrodes from being exposed, so that it is possible to reduce the reflection characteristics and the reflectivity of the touch electrodes. In this manner, the light blocking patterns may reduce the effect of reflected light due to the touch electrodes, thereby increasing the position code pattern recognition rate and accuracy of the position input device 20. Detailed structures of the position code patterns as well as the touch sensing unit TSU and the light blocking pattern will be described in more detail later with reference to the accompanying drawings.

The display driver 200 may output signals and voltages for driving the display unit DU of the display panel 100. The display driver 200 may supply data voltages to data lines connected to the pixels. The display driver 200 may supply a power voltage to a power line and may supply gate control signals to a gate driver. The power line may provide power to the display panel 100. The gate driver may provide a gate signal to a gate line connected to a pixel to enable the pixel to receive a data voltage from one of the data lines or prevent the pixel from receiving the data voltage.

The touch driver 400 may be connected to the touch sensing unit TSU. The touch driver 400 may supply a touch driving signal to a plurality of touch electrodes of the touch sensing unit TSU and may sense an amount of change in capacitance between the plurality of touch electrodes. The touch driver 400 may calculate whether a user's touch has been input and touch coordinates of the user's touch based on an amount of change in capacitance between the plurality of touch electrodes.

The main processor 500 may control all functions of the display device 10. For example, the main processor 500 may supply digital video data to the display driver 200 such that the display panel 100 displays an image. Further, the main processor 500 may receive touch data from the touch driver 400 to determine a user's touch coordinates, and then may generate digital video data according to the determined touch coordinates, or execute an application indicated by an icon displayed on the user's touch coordinates.

On the other hand, the main processor 500 receives the position coordinate data from the position input device 20 to determine the pointer or the position coordinates of the arrangement direction of the position input device 20. Further, the main processor 500 may generate digital video data according to the pointer or the arrangement position coordinates of the position input device 20, or execute an application indicated by an icon displayed on the arrangement position coordinates of the position input device 20.

The communication unit 600 may perform wired/wireless communication with an external device. For example, the communication unit 600 may transmit/receive a communication signal to/from a communication module 24 (e.g., a receiver, a transceiver, a communication device, etc.) of the position input device 20. The communication unit 600 may receive position coordinate data including one or more data codes from the position input device 20, and may provide the position coordinate data to the main processor 500.

The position input device 20 may be positioned on the front side of the display panel 100 when it is used by a user. The position input device 20 detects the pointer or the arrangement position coordinates on the front side of the display panel 100 by recognizing the position code patterns of the display panel 100 on the front side of the display panel 100. Specifically, the position input device 20 senses light reflected from the position code pattern of the display panel 100 using an optical method. Further, the position code patterns may be detected based on the sensed light, and position coordinate data corresponding to the position code patterns may be generated. The position input device 20 may be an electronic pen such as a smart pen having a shape of a writing instrument, but is not limited to the shape or structure of the writing instrument.

In an embodiment, the position input device 20 includes a code detector 21 (e.g., a detection circuit), a piezoelectric sensor 22, a code processor 23, a communication module 24, and a memory 25.

The code detector 21 is disposed near the pen point of the position input device 20 to sense the position code patterns included in the display panel 100 of the display device 10. The code detector 21 includes a light emitting unit 21(*a*) (e.g., a light emitter) for emitting infrared light using at least one infrared light source, and a light receiving unit 21(*b*) (e.g., a light receiver) for detecting infrared light reflected from the position code patterns using an infrared camera.

At least one infrared light source included in the light emitting unit 21(*a*) may include an infrared LED array having a matrix structure. Further, the infrared camera of the light receiving unit 21(*b*) may include a filter for blocking a wavelength band other than that of infrared light and transmitting infrared light, a lens system for focusing the infrared light that has passed through the filter, an optical image sensor for converting the optical image formed by the lens system into an electrical image signal and outputting the electrical image signal, and the like. The optical image sensor may include an array of a matrix structure similar to that of the infrared LED array, and provide shape data of the position code patterns to the code processor 23 depending on types of infrared lights reflected from the position code patterns of the display unit DU. In this manner, the code detector 21 of the position input device 20 may continuously detect the position code patterns included in the display unit DU in response to user's control and movement, and continuously generate the shape data of the position code patterns and provide it to the code processor 23.

The code processor 23 may continuously receive the shape data of the position code patterns from the code detector 21. For example, the code processor 23 may continuously receive the shape data of the position code patterns, and may identify the arrangement structure and shape of the position code patterns. The code processor 23 may extract or generate a data code corresponding to the arrangement structure and shape of the position code patterns, combine data codes, and extract or generate position coordinate data corresponding to the combined data code. The code processor 23 may transmit the generated position coordinate data to the display device 10 through the communication module 24. In particular, the code processor 23 may quickly generate coordinate data without complicated calculation and correction by receiving the shape data of the position code patterns and generating and converting the data codes respectively corresponding to the position code patterns.

The communication module 24 may perform wired/wireless communication with an external device. For example, the communication module 24 may transmit/receive a communication signal to/from the communication unit 600 of the display device 10. The communication module 24 may receive position coordinate data including data codes from the code processor 23, and may provide the position coordinate data to the communication unit 600. The data codes maybe unique from one another to identify each of the position code patterns.

The memory 25 may store data necessary for driving the position input device 20. The memory 25 may store the shape data of the position code patterns, and the data codes respectively corresponding to the shape data and the position code patterns. Further, the memory 25 may store the data codes and the position coordinate data corresponding to the combination of the data codes. The memory 25 shares with the code processor 23 the data codes respectively corresponding to the shape data and the position code patterns, and the position coordinate data corresponding to the combination of the data codes. Accordingly, the code processor 23 may generate a combined data code using the data codes and the position coordinate data stored in the memory 25, and extract or generate the position coordinate data corresponding to the combined data code.

Figure 3:
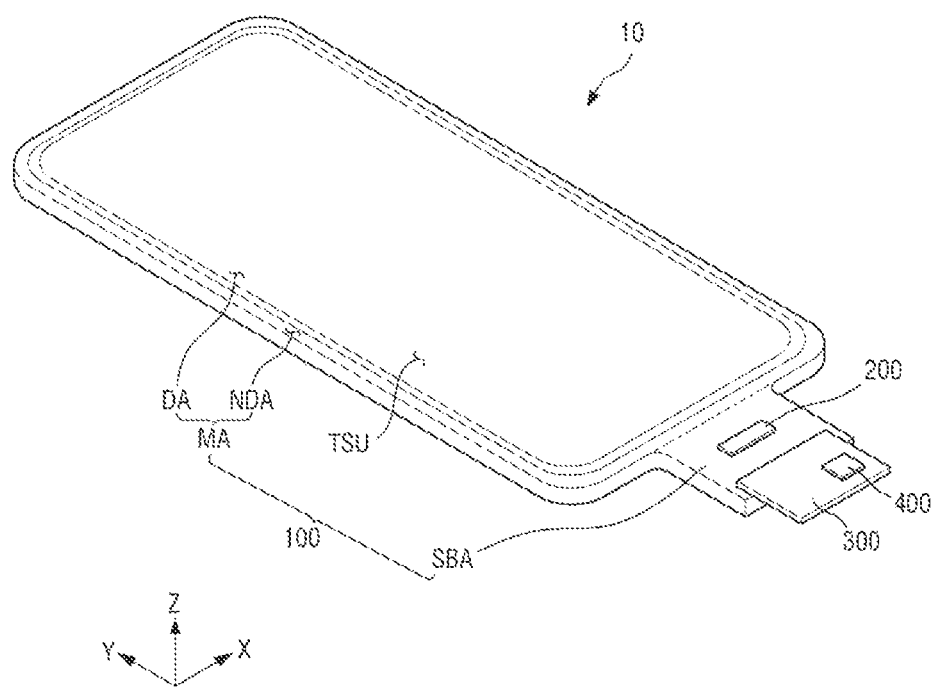
FIG. 3 is a perspective view illustrating the configuration of the display device illustrated in FIG. 1.
Figure 4:
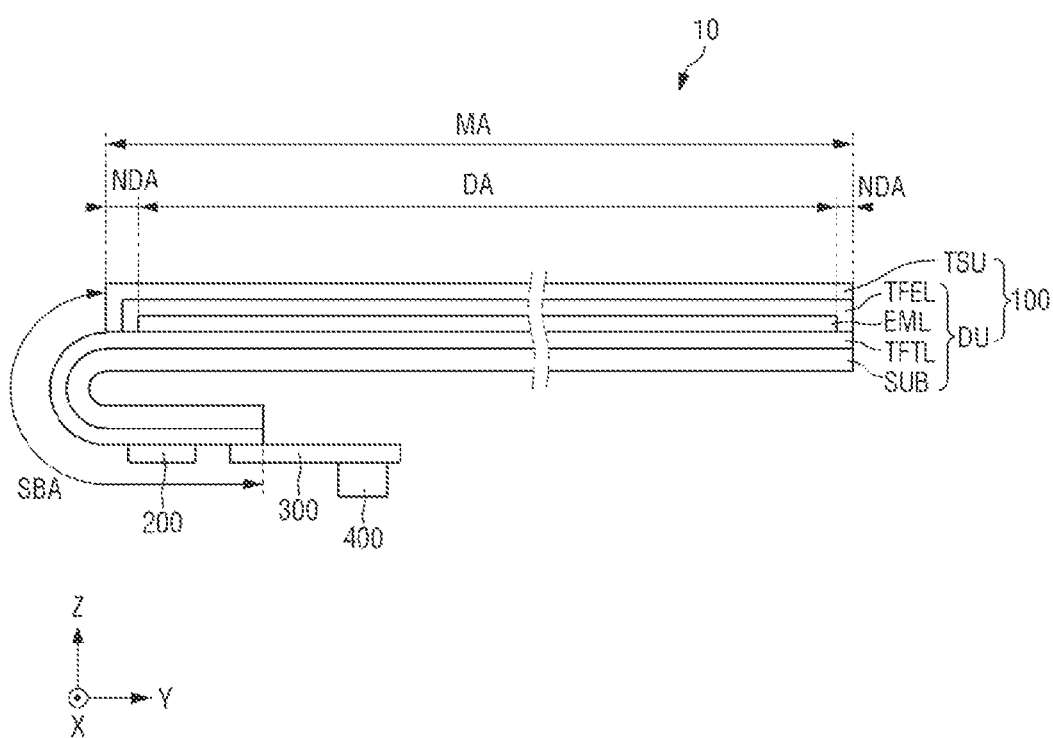
FIG. 4 is a cross-sectional view showing the configuration of the display device illustrated in FIGS. 1 and 3.

FIG. 3 is a perspective view specifically illustrating an exemplary configuration of the display device illustrated in FIG. 1. FIG. 4 is a cross-sectional view specifically showing the configuration of the display device illustrated in FIGS. 1 and 3.

Referring to FIGS. 3 and 4, the display device 10 may have a shape similar to a quadrilateral shape in a plan view. For example, the display device 10 may have a shape similar to a quadrilateral shape, in a plan view, having short sides in an X-axis direction and long sides in a Y-axis direction. A corner where the short side in the X-axis direction and the long side in the Y-axis direction meet may be rounded to have a predetermined curvature or may be right-angled. The planar shape of the display device 10 is not limited to a quadrilateral shape, and may be formed in a shape similar to another polygonal shape, a circular shape, or elliptical shape. The display panel 100 may be formed to be flat, but is not limited thereto. For example, the display panel 100 may include a curved portion formed at left and right ends and having a predetermined curvature or a varying curvature. The display panel 100 may be flexible so it can be bent, folded, or rolled.

The display panel 100 may include a main region MA and a sub-region SBA. The main region MA includes a display area DA displaying an image and a non-display area NDA that is a peripheral area of the display area DA. The display area DA may emit light from a plurality of unit pixels and a plurality of opening areas (or emission areas) corresponding to the unit pixels. The display panel 100 may include a pixel circuit including switching elements, a pixel defining layer defining an emission area or an opening area, a self-light emitting element, and the like. The non-display area NDA may be an area outside the display area DA. The unit pixels are not present in the non-display area NDA. The non-display area NDA may be defined as an edge area of the main region MA of the display panel 100. The non-display area NDA may include a gate driver (not illustrated) that supplies gate signals to a gate lines connected to the unit pixels, and fan-out lines (not illustrated) that connect the display driver 200 to the display area DA.

The plurality of unit pixels are arranged in first and second directions (X-axis and Y-axis directions) in the display area DA of the display panel 100, and each unit pixel includes a plurality of sub-pixels. The plurality of unit pixels are configured to display an image using the plurality of sub-pixels. The plurality of sub-pixels may be arranged in a pentile™ matrix structure. Alternatively, the plurality of sub-pixels may be arranged in a vertical or horizontal stripe structure. The display area DA in which the plurality of unit pixels are arranged may occupy most of the main region MA.

The sub-region SBA may extend from one side of the main region MA. The sub-region SBA may contain a flexible material which can be bent, folded, or rolled. For example, when the sub-region SBA is bent, the sub-region SBA may overlap the main region MA in a thickness direction (Z-axis direction). The sub-region SBA may include the display driver 200 and a pad unit connected to the circuit board 300. Optionally, the sub-region SBA may be omitted, and the display driver 200 and the pad unit may be arranged in the non-display area NDA.

The display driver 200 may be formed as an integrated circuit (IC) and mounted on the display panel 100 by a chip on glass (COG) method, a chip on plastic (COP) method, or an ultrasonic bonding method. For example, the display driver 200 may be disposed in the sub-region SBA, and may overlap the main region MA in the thickness direction (Z-axis direction) by bending of the sub-region SBA. In another example, the display driver 200 may be mounted on the circuit board 300.

The circuit board 300 may be attached to the pad unit of the display panel 100 by an anisotropic conductive film (ACF). Lead lines of the circuit board 300 may be electrically connected to a pad unit of the display panel 100. The circuit board 300 may be a flexible printed circuit board, a printed circuit board, or a flexible film such as a chip on film.

A touch driver 400 may be mounted on the circuit board 300. The touch driver 400 may be formed of an integrated circuit (IC). As described above, the touch driver 400 may supply a touch driving signal to a plurality of touch electrodes of the touch sensing unit TSU and may sense an amount of change in capacitance between the plurality of touch electrodes. Here, the touch driving signal may be a pulse signal having a predetermined frequency. For example, the touch driving signal may include signals that transition from one logic level to another logic level. The touch driver 400 may determine whether or not a user's touch using a finger or the like has been input and calculate touch coordinates based on an amount of change in capacitance between the plurality of touch electrodes.

Referring to FIG. 4, the display panel 100 may include a display unit DU, and a touch sensing unit TSU in a cross-sectional view. The display panel 100 may additionally include a polarizing film in the cross-sectional view. The display unit DU may include the substrate SUB, the thin film transistor layer TFTL, the light emitting element layer EML, and the encapsulation layer TFEL.

The substrate SUB may be a base substrate or a base member. The substrate SUB may be a flexible substrate which can be bent, folded, or rolled. For example, the substrate SUB may include a glass material or a metal material, but is not limited thereto. In another example, the substrate SUB may include a polymer resin such as polyimide (PI).

The thin film transistor layer TFTL may be disposed on the substrate SUB. The thin film transistor layer TFTL may include a plurality of thin film transistors that form pixel circuits for each of the pixels. The thin film transistor layer TFTL may further include gate lines, data lines, power lines, gate control lines, fan-out lines that connect the display driver 200 to the data lines, and lead lines that connect the display driver 200 to the pad unit. When the gate driver is formed on one side of the non-display area NDA of the display panel 100, the gate driver may also include thin film transistors.

The thin film transistor layer TFTL may be disposed in the display area DA, the non-display area NDA, and the sub-region SBA. Thin film transistors, gate lines, data lines, and power lines of each of the pixels of the thin film transistor layer TFTL may be disposed in the display area DA. Gate control lines and fan-out lines of the thin film transistor layer TFTL may be disposed in the non-display area NDA. The lead lines of the thin film transistor layer TFTL may be disposed in the sub-region SBA.

The light emitting element layer EML may be disposed on the thin film transistor layer TFTL. The light emitting element layer EML may include a plurality of light emitting elements in which a first electrode, a light emitting layer, and a second electrode are sequentially stacked to emit light, and a pixel defining layer defining pixels. The plurality of light emitting elements of the light emitting element layer EML may be disposed in the display area DA. The light emitting layer may be an organic light emitting layer containing an organic material. The light emitting layer may include a hole transporting layer, an organic light emitting layer, and an electron transporting layer. When the first electrode receives a predetermined voltage through the thin film transistor of the thin film transistor layer TFTL and the second electrode receives the cathode voltage, holes and electrons may be transferred to the organic light emitting layer through the hole transporting layer and the electron transporting layer, respectively and may be combined with each other to emit light in the organic light emitting layer. For example, the first electrode may be an anode electrode, and the second electrode may be a cathode electrode, but the present disclosure is not limited thereto.

In another example, the plurality of light emitting elements may include a quantum dot light emitting diode including a quantum dot light emitting layer or an inorganic light emitting diode including an inorganic semiconductor.

The encapsulation layer TFEL may cover the top surface and the side surface of the light emitting element layer EML, and may protect the light emitting element layer EML. The encapsulation layer TFEL may include at least one inorganic layer and at least one organic layer for encapsulating the light emitting element layer EML.

The touch sensing unit TSU may be disposed on the encapsulation layer TFEL. The touch sensing unit TSU may include a plurality of touch electrodes for sensing a user's touch in a capacitive manner, and touch lines connecting the plurality of touch electrodes to the touch driver 400. For example, the touch sensing unit TSU may sense a user's touch using a self-capacitance method or a mutual capacitance method.

In another example, the touch sensing unit TSU may be disposed on a separate substrate disposed on the display unit DU. In this case, the substrate supporting the touch sensing unit TSU may be a base member that encapsulates the display unit DU.

The plurality of touch electrodes of the touch sensing unit TSU may be disposed in a touch sensor area overlapping the display area DA. The touch lines of the touch sensing unit TSU may be disposed in a touch peripheral area that overlaps the non-display area NDA.

The sub-region SBA of the display panel 100 may extend from one side of the main region MA. The sub-region SBA may contain a flexible material which can be bent, folded, or rolled. For example, when the sub-region SBA is bent, the sub-region SBA may overlap the main region MA in a thickness direction (Z-axis direction). The sub-region SBA may include the display driver 200 and the pad unit connected to the circuit board 300.

Figure 5:
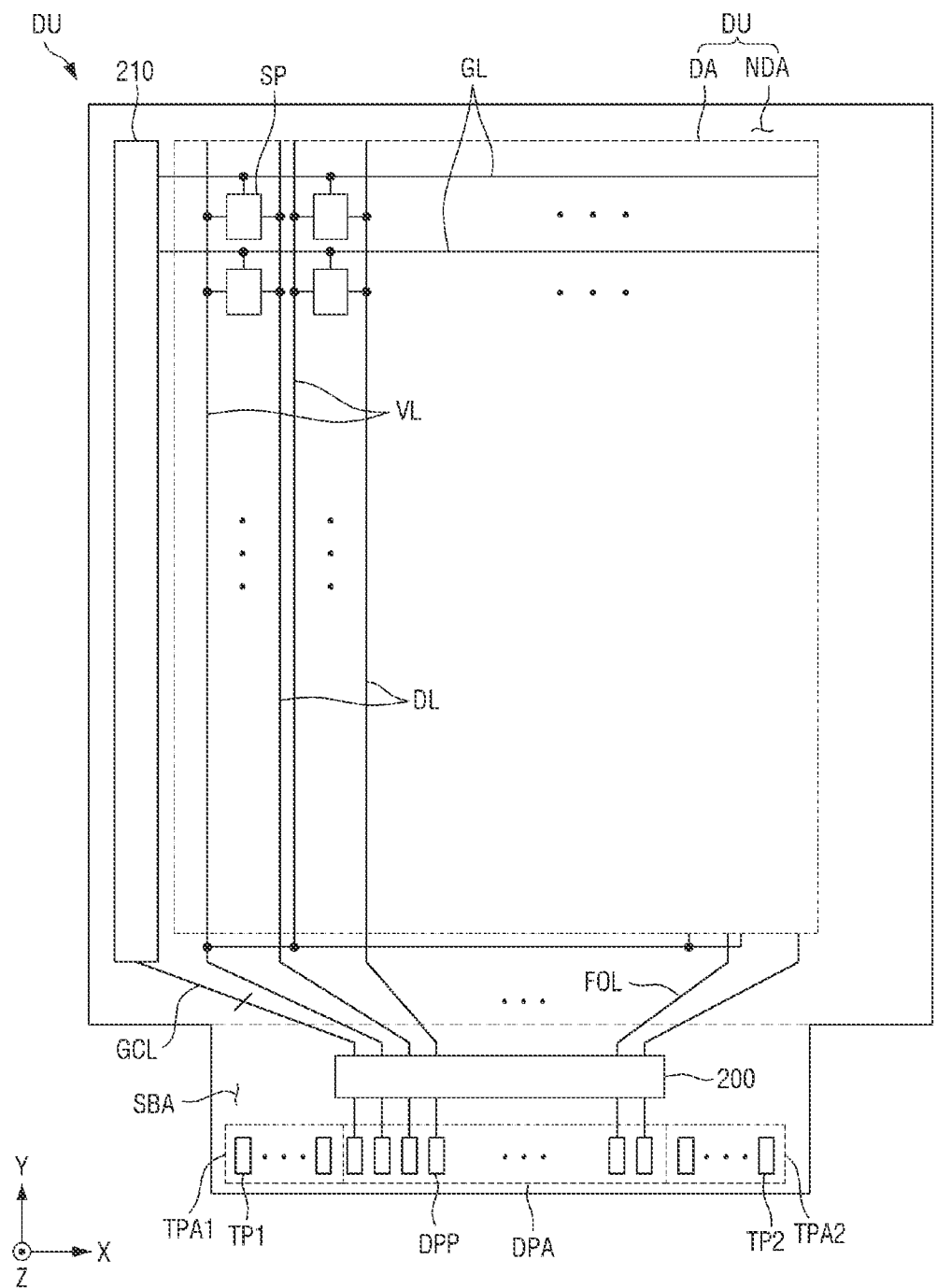
FIG. 5 is a plan view illustrating a display unit of a display device according to an embodiment.

FIG. 5 is a plan view illustrating a display unit of a display device according to an embodiment.

Referring to FIG. 5, the display area DA of the display unit DU, which is an area for displaying an image, may be defined as the central area of the display panel 100. The display area DA may include a plurality of sub-pixels SP, a plurality of gate lines GL, a plurality of data lines DL, and a plurality of power lines VL. Each of the plurality of sub-pixels SP may be defined as the smallest unit that outputs light.

The plurality of gate lines GL may supply the gate signals received from the gate driver 210 to the plurality of sub-pixels SP. The plurality of gate lines GL may extend in the X-axis direction and may be spaced apart from each other in the Y-axis direction that crosses the X-axis direction.

The plurality of data lines DL may supply the data voltages received from the display driver 200 to the plurality of sub-pixels SP. The plurality of data lines DL may extend in the Y-axis direction and may be spaced apart from each other in the X-axis direction.

The plurality of power lines VL may supply the power voltage received from the display driver 200 to the plurality of pixels SP. Here, the power voltage may be at least one of a driving voltage, an initialization voltage, or a reference voltage. The plurality of power lines VL may extend in the Y-axis direction and may be spaced apart from each other in the X-axis direction.

The non-display area NDA of the display unit DU may surround the display area DA. The non-display area NDA may include the gate driver 210, fan-out lines FOL, and gate control lines GCL. The gate driver 210 may generate a plurality of gate signals based on the gate control signal, and may sequentially supply the plurality of gate signals to the plurality of gate lines GL according to a set order.

The fan-out lines FOL may extend from the display driver 200 to the display area DA. The fan-out lines FOL may supply the data voltage received from the display driver 200 to the plurality of data lines DL.

The gate control line GCL may extend from the display driver 200 to the gate driver 210. The gate control line GCL may supply the gate control signal received from the display driver 200 to the gate driver 210.

The sub-region SBA may include the display driver 200, a display pad area DPA, and first and second touch pad areas TPA1 and TPA2.

The display driver 200 may output signals and voltages for driving the display panel 100 to the fan-out lines FOL. The display driver 200 may supply a data voltage to the data line DL through the fan-out lines FOL. The data voltage may be supplied to the plurality of sub-pixels SP to determine the luminance of the plurality of sub-pixels SP. The display driver 200 may supply the gate control signal to the gate driver 210 through the gate control line GCL.

The display pad area DPA, the first touch pad area TPA1, and the second touch pad area TPA2 may be disposed at the edge of the sub-region SBA. The display pad area DPA, the first touch pad area TPA1, and the second touch pad area TPA2 may be electrically connected to the circuit board 300 by using an anisotropic conductive film or a low-resistance high-reliability material such as SAP.

The display pad area DPA may include a plurality of display pad units DPP. The plurality of display pad units DPP may be connected to the main processor 500 through the circuit board 300. The plurality of display pad units DPP may be connected to the circuit board 300 to receive digital video data, and may supply the digital video data to the display driver 200.

Figure 6:
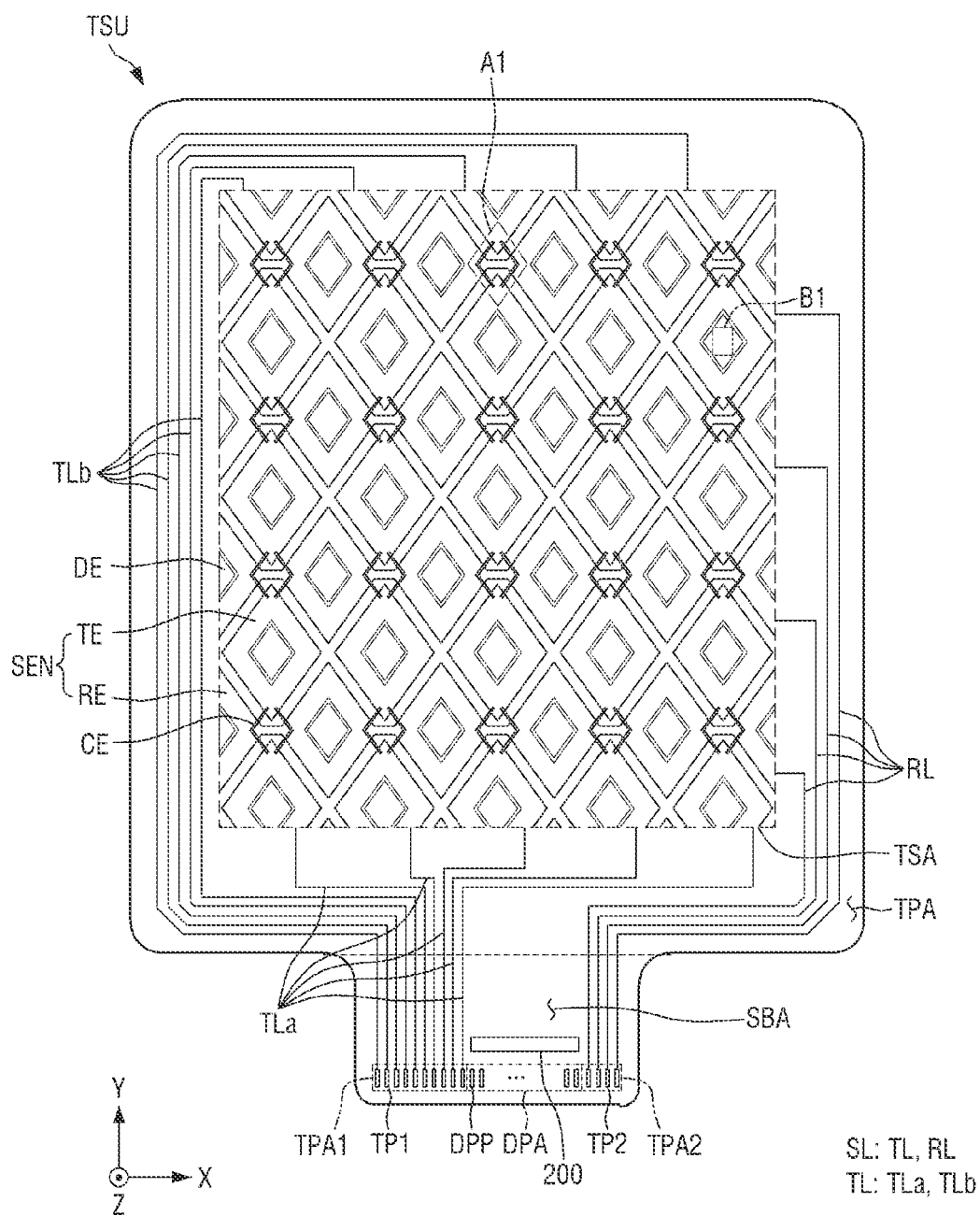
FIG. 6 is a plan view illustrating a touch sensing unit of a display device according to an embodiment.

FIG. 6 is a plan view illustrating a touch sensing unit of a display device according to an embodiment.

Referring to FIG. 6, the touch sensing unit TSU may include a touch sensor area TSA for sensing a user's touch, and a touch peripheral area TPA disposed around the touch sensor area TSA. The touch sensor area TSA may overlap the display area DA of the display unit DU, and the touch peripheral area TPA may overlap the non-display area NDA of the display unit DU.

The touch sensor area TSA may include a plurality of touch electrodes SEN and a plurality of dummy electrodes DE. The plurality of touch electrodes SEN may form mutual capacitance or self-capacitance to sense a touch of an object or a person. The plurality of touch electrodes SEN may include a plurality of driving electrodes TE and a plurality of sensing electrodes RE. In an embodiment, the dummy electrodes DE include some of the electrodes located on an outer periphery of the touch sensing unit TSU.

The plurality of driving electrodes TE may be arranged in the X-axis direction and the Y-axis direction. The plurality of driving electrodes TE may be spaced apart from each other in the X-axis direction and the Y-axis direction. The driving electrodes TE adjacent in the Y-axis direction may be electrically connected through a plurality of connection electrodes CE.

The plurality of driving electrodes TE may be connected to a first touch pad unit TP1 through a driving line TL. The driving line TL may include a lower driving line TLa and an upper driving line TLb. For example, some of the driving electrodes TE disposed under the touch sensor area TSA may be connected to the first touch pad unit TP1 through the lower driving line TLa, and the other driving electrodes TE disposed on the upper side of the touch sensor area TSA may be connected to the first touch pad unit TP1 through the upper driving line TLb. The lower driving line TLa may extend to the first touch pad unit TP1 through the lower side of the touch peripheral area TPA. The upper driving line TLb may extend to the first touch pad unit TP1 through the upper side, the left side, and the lower side of the touch peripheral area TPA. The first touch pad unit TP1 may be connected to the touch driver 400 through the circuit board 300.

The connection electrode CE may be bent at least once. For example, the connection electrode CE may have an angle bracket shape ("<" or ">"), but the planar shape of the connection electrode CE is not limited thereto. The driving electrodes TE adjacent to each other in the Y-axis direction may be electrically connected by a plurality of connection electrodes CE, and even though any one of the connection electrodes CE becomes disconnected, the driving electrodes TE may be stably connected through the remaining connection electrode CE. The driving electrodes TE adjacent to each other may be connected by two connection electrodes CE, but the number of connection electrodes CE is not limited thereto.

The connection electrode CE may be disposed on a different layer from the plurality of driving electrodes TE and the plurality of sensing electrodes RE. The sensing electrodes RE adjacent in the X-axis direction may be electrically connected through a connection portion disposed on the same layer as the plurality of driving electrodes TE or the plurality of sensing electrodes RE. That is, the plurality of sensing electrodes RE may extend in the X-axis direction and may be spaced apart from each other in the Y-axis direction. The plurality of sensing electrodes RE may be arranged in the X-axis direction and the Y-axis direction, and the sensing electrodes RE adjacent in the X-axis direction may be electrically connected through a connection portion.

The driving electrodes TE adjacent in the Y-axis direction may be electrically connected through the connection electrode CE disposed on a different layer from the plurality of driving electrodes TE or the plurality of sensing electrodes RE. The connection electrodes CE may be formed on a rear surface layer (or a lower layer) of the layer on which the driving electrodes TE and the sensing electrodes RE are formed. In an embodiment, the connection electrodes CE are electrically connected to the adjacent driving electrode TE through a plurality of contact holes.

Accordingly, even though the connection electrodes CE overlap the plurality of sensing electrodes RE in the Z-axis direction, the plurality of driving electrodes TE and the plurality of sensing electrodes RE may be insulated from each other. Mutual capacitance may be formed between the driving electrode TE and the sensing electrode RE.

The plurality of sensing electrodes RE may be connected to the second touch pad unit TP2 through a sensing line RL. For example, some of the sensing electrodes RE disposed on the right side of the touch sensor area TSA may be connected to the second touch pad unit TP2 through the sensing line RL. The sensing line RL may extend to the second touch pad unit TP2 through the right side and the lower side of the touch peripheral area TPA. The second touch pad unit TP2 may be connected to the touch driver 400 through the circuit board 300.

Each of the plurality of dummy electrodes DE may be surrounded by the driving electrode TE or the sensing electrode RE. Each of the dummy electrodes DE may be insulated by being spaced apart from the driving electrode TE or the sensing electrode RE. Accordingly, the dummy electrode DE may be electrically floating.

In an embodiment, the position code patterns of a planar code shape are formed at preset intervals on partial front surfaces of at least one of the plurality of driving electrodes TE, the plurality of sensing electrodes RE, and the plurality of dummy electrodes DE. Further, the light blocking pattern is formed on the front surfaces of the other touch electrodes except the area where the position code patterns are formed.

The display pad area DPA, the first touch pad area TPA1, and the second touch pad area TPA2 may be disposed at the edge of the sub-region SBA. The display pad area DPA, the first touch pad area TPA1, and the second touch pad area TPA2 may be electrically connected to the circuit board 300 by using an anisotropic conductive film or a low-resistance high-reliability material such as SAP.

The first touch pad area TPA1 may be disposed on one side of the display pad area DPA, and may include a plurality of first touch pad units TP1. The plurality of first touch pad units TP1 may be electrically connected to the touch driver 400 disposed on the circuit board 300. The plurality of first touch pad units TP1 may supply a touch driving signal to the plurality of driving electrodes TE through a plurality of driving lines TL.

The second touch pad area TPA2 may be disposed on the other side of the display pad area DPA, and may include a plurality of second touch pad units TP2. The plurality of second touch pad units TP2 may be electrically connected to the touch driver 400 disposed on the circuit board 300. The touch driver 400 may receive a touch sensing signal through a plurality of sensing lines RL connected to the plurality of second touch pad units TP2, and may sense a change in mutual capacitance between the driving electrode TE and the sensing electrode RE.

In another example, the touch driver 400 may supply a touch driving signal to each of the plurality of driving electrodes TE and the plurality of sensing electrodes RE, and may receive a touch sensing signal from each of the plurality of driving electrodes TE and the plurality of sensing electrodes RE. The touch driver 400 may sense an amount of change in electric charge of each of the plurality of driving electrodes TE and the plurality of sensing electrodes RE based on the touch sensing signal.

Figure 7:
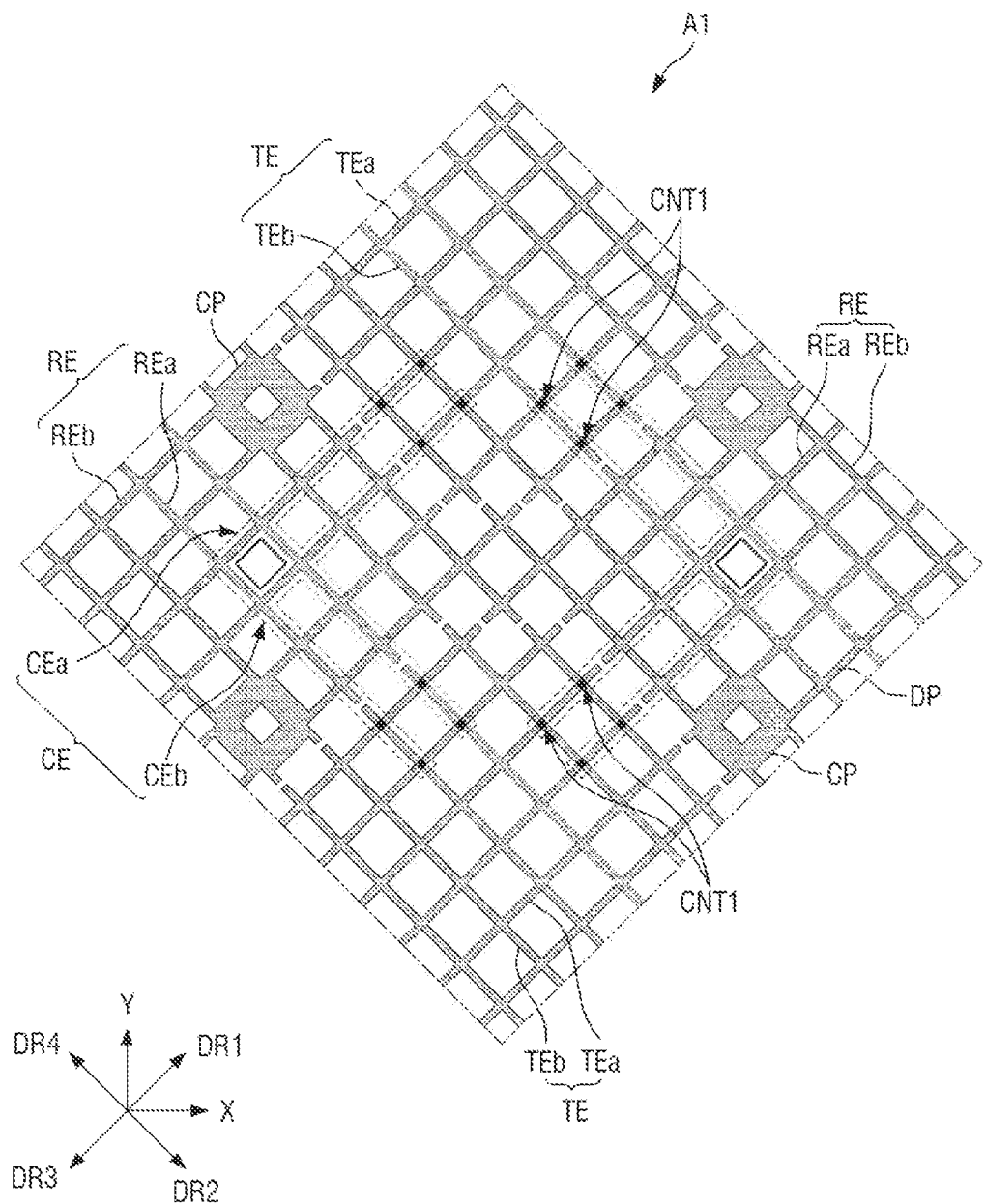
FIG. 7 is an enlarged view illustrating position code patterns and a light blocking pattern formed in area A1 of FIG. 6.

FIG. 7 is an enlarged view illustrating position code patterns and a light blocking pattern formed in area A1 of FIG. 6. Further, FIG. 8 is an enlarged view illustrating area A1 in which the position code patterns and the light blocking pattern according to an embodiment are disposed.

Figure 8:
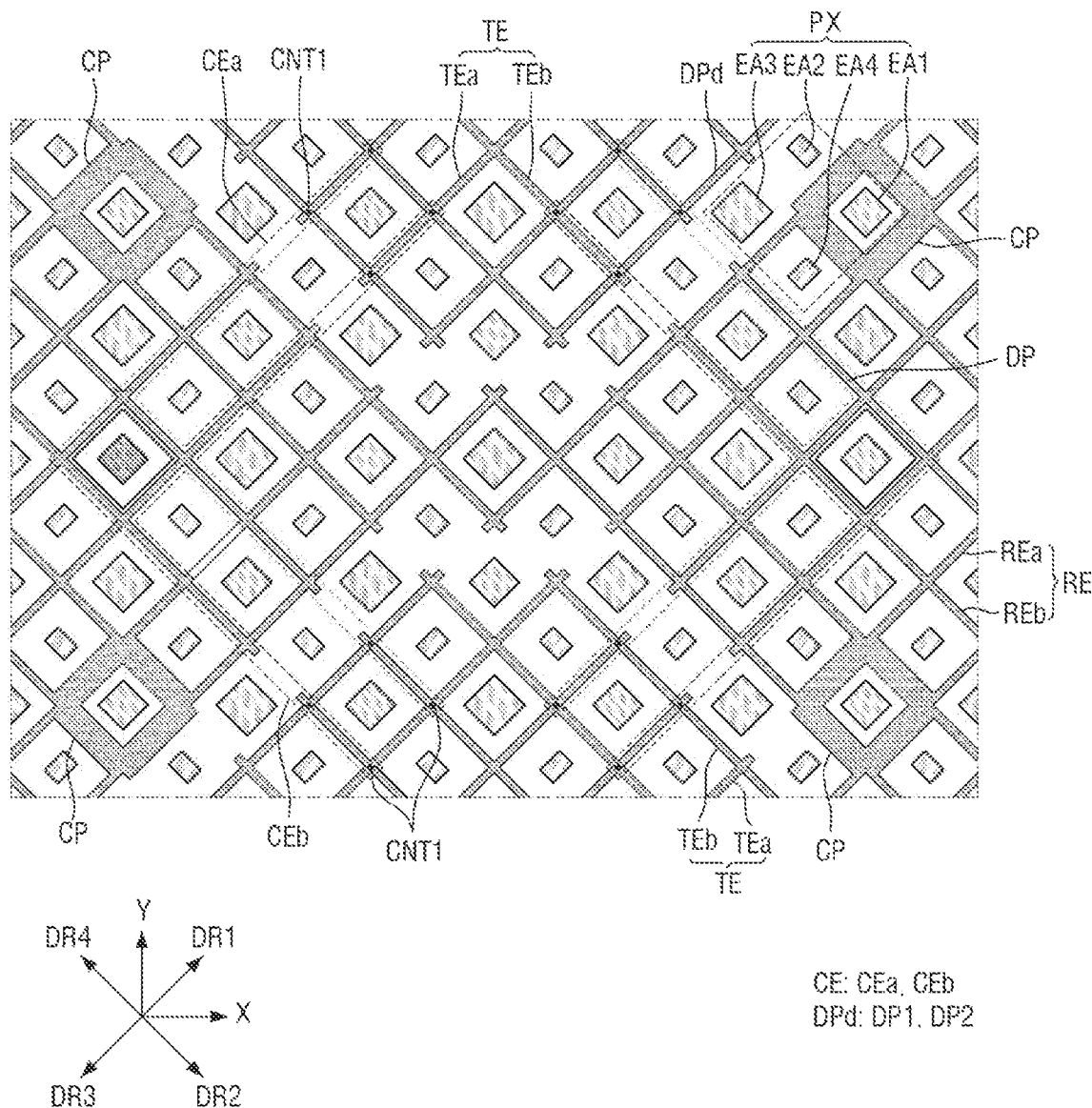
FIG. 8 is an enlarged view illustrating area A1 in which the position code patterns and the light blocking pattern according to an embodiment are disposed.

Referring to FIGS. 7 and 8, the plurality of driving electrodes TE, the plurality of sensing electrodes RE, and the plurality of dummy electrodes DE may be disposed on the same layer and may be spaced apart from each other.

The plurality of driving electrodes TE may be arranged in the X-axis direction and the Y-axis direction. The plurality of driving electrodes TE may be spaced apart from each other in the X-axis direction and the Y-axis direction. The driving electrodes TE adjacent in the Y-axis direction may be electrically connected through the connection electrode CE.

The plurality of sensing electrodes RE may extend in the X-axis direction and may be spaced apart from each other in the Y-axis direction. The plurality of sensing electrodes RE may be arranged in the X-axis direction and the Y-axis direction, and the sensing electrodes RE adjacent in the X-axis direction may be electrically connected. For example, the sensing electrodes RE may be electrically connected through a connection portion, and the connection portion may be disposed within the shortest distance between the driving electrodes TE adjacent to each other.

The plurality of connection electrodes CE may be disposed on a layer different from the driving electrode TE and the sensing electrode RE, e.g., on a rear surface layer. The connection electrode CE may include a first portion CEa and a second portion CEb. For example, the first portion CEa of the connection electrode CE may be connected to the driving electrode TE disposed on one side through a first contact hole CNT1 and extend in a third direction DR3. The second portion CEb of the connection electrode CE may be bent from the first portion CEa in an area overlapping the sensing electrode RE to extend in a second direction DR2, and may be connected to the driving electrode TE disposed on the other side through the first contact hole CNT1. Hereinafter, a first direction DR1 may be a direction between the X-axis direction and the Y-axis direction, a second direction DR2 may be a direction between the opposite direction of the Y-axis and the X-axis direction, a third direction DR3 may be an opposite direction of the first direction DR1, and a fourth direction DR4 may be an opposite direction of the second direction DR2. Accordingly, each of the plurality of connection electrodes CE may connect the adjacent driving electrodes TE in the Y-axis direction.

As described above, each unit pixel PX may include first to third sub-pixels or first to fourth sub-pixels, and each of the first to fourth sub-pixels may include first to fourth emission areas EA1, EA2, EA3, and EA4. For example, the first emission area EA1 may emit light of a first color or red light, the second emission area EA2 may emit light of a second color or green light, and the third emission area EA3 may emit light of a third color or blue light. Further, the fourth emission area EA4 may emit light of a fourth color or light of any one of the first to third colors, but the present disclosure is not limited thereto.

Each unit pixel PX may express a white gray level through the first to third emission areas EA1 to EA3 or the first to fourth emission areas EA1, EA2, EA3, and EA4. Further, gray levels of various colors such as white and the like may be expressed by a combination of lights emitted from the first to third emission areas EA1, EA2, and EA3 or the first to fourth emission areas EA1, EA2, EA3, and EA4.

Depending on the arrangement structure of the first to third sub-pixels or the first to fourth sub-pixels, the plurality of driving electrodes TE, the plurality of sensing electrodes RE, and the plurality of dummy electrodes DE may be formed in a mesh structure or a net structure in a plan view.

The plurality of driving electrodes TE, the plurality of sensing electrodes RE, and the plurality of dummy electrodes DE may surround the spaces between the first to third emission areas EA1 to EA3 or the first to fourth emission areas EA1, EA2, EA3, and EA4 forming the unit pixel PX and the outer sides thereof in a plan view. Accordingly, the plurality of driving electrodes TE, the plurality of sensing electrodes RE, and the plurality of dummy electrodes DE may not overlap first to fourth emission areas EA1, EA2, EA3, and EA4. The plurality of connection electrodes CE may also not overlap the first to third emission areas EA1, EA2, EA3, and EA4. Accordingly, the display device 10 may prevent the luminance of light emitted from the first to fourth emission areas EA1, EA2, EA3, and EA4 from being reduced by the touch sensing unit TSU.

Each of the plurality of driving electrodes TE is formed to include a first portion TEa extending in the first direction DR1 and a second portion TEb extending in the second direction DR2, and thus do not overlap the first to fourth emission areas EA1, EA2, EA3, and EA4. Further, each of the plurality of sensing electrodes RE is formed to include a first portion REa extending in the first direction DR1 and a second portion REb extending in the second direction DR2, and thus do not overlap the first to fourth emission areas EA1 to EA4. The plurality of dummy electrodes DE are also formed so as not to overlap the first to fourth emission areas EA1 to EA4.

Position code patterns CP and light blocking patterns DP are formed on partial front surfaces of the plurality of dummy electrodes DE, the plurality of driving electrodes TE, and the plurality of sensing electrodes RE corresponding to preset position code forming areas. The position code patterns CP and the light blocking pattern DP may be integrally formed by the same patterning process. For example, a single unitary layer may include a code pattern CP and a light blocking pattern DP.

In an embodiment, the position code patterns CP are formed at preset intervals (e.g., about 300 μm) on the partial front surfaces of the plurality of dummy electrodes DE, the plurality of driving electrodes TE, and the plurality of sensing electrodes RE. When the position code patterns CP are formed, the light blocking pattern DP is formed on the front surfaces of the plurality of dummy electrodes DE, the plurality of driving electrodes TE, and the plurality of sensing electrodes RE except the area where the position code patterns CP are formed.

The position code patterns CP are formed by covering the partial front surfaces of at least one of the plurality of driving electrodes TE, the plurality of sensing electrodes RE, and the plurality of dummy electrodes DE in a planar code shape or a planar code pattern shape of a preset size. For example, a position code pattern CP may cover a surface of some of the dummy electrodes DE, a surface of some of the driving electrodes TE, or cover a surface of some of the sensing electrodes RE. In an embodiment, the position code patterns CP are formed to have a width or size greater than that of the light blocking pattern DP by covering not only the partial front surfaces of the electrodes but also at least one side surface as well as the front surfaces thereof.

The position code patterns CP may be formed to minimize the reflectivity of infrared light applied from the position input device 20 by blocking and reflecting the infrared light, and may be recognized as position code patterns by the position input device 20 depending on the code pattern shape in which the reflectivity of the infrared light is minimized. In an embodiment, the position code patterns CP are formed to have a width greater than the width of the light blocking pattern DP in at least one direction.

In an embodiment, the width or size in at least one of the X-axis and Y-axis directions and the first to fourth directions DR1 to DR4 of the position code patterns CP is greater than the width or size in the X and Y directions and the first to second directions DR1 to DR4 of the light blocking pattern DP. In this case, the X-axis and Y-axis directions may be vertical and horizontal directions, respectively, and the first to fourth directions DR1 to DR4 may be diagonal directions with respect to the X-axis and Y-axis directions. An inclined surface having a preset inclination may be further formed on the side surfaces and front surfaces of the position code patterns CP thus formed.

The planar code pattern shape of the position code patterns CP may be at least one polygonal pattern shape selected among a rectangle, a square, a circle, a semicircle, a sector, and a rhombus, or may be a pattern shape in which a plurality of polygonal pattern shapes are combined. Further, the planar code pattern shape of the position code patterns CP may be a closed loop pattern shape such as a rectangle, a square, a rhombus, a pentagon, a hexagon, or the like which surrounds at least one emission area. Alternatively, the planar code pattern shape of the position code patterns CP may be an open loop shape partially surrounding at least one emission area. Further, the planar code shape of the position code patterns CP may be a straight or curved pattern shape of a preset length. On the other hand, when the position code patterns CP do not surround one emission area but surround the spaces between all the plurality of emission areas and the outer sides thereof, the position code patterns CP may have a shape of a mesh structure and a net pattern structure in a plan view.

The light blocking pattern DP may be formed simultaneously with the position code patterns CP during the formation of the position code patterns CP, and may be formed in the other areas except the area where the position code patterns CP are formed. In other words, the light blocking pattern DP may be formed to cover the front surfaces of the plurality of dummy electrodes DE, the plurality of driving electrodes TE, and the plurality of sensing electrodes RE where the position code patterns CP are not formed. Since the light blocking pattern DP and the code patterns CP are formed by the same process, the light blocking pattern DP and the position code patterns CP may be made of the same material.

The position code patterns CP and the light blocking pattern DP are formed of light blocking members made of a material that absorbs light. The position code patterns CP and the light blocking pattern DP may be formed by a patterning process using one mask or a half tone mask. In this case, the light blocking pattern DP is formed to have a preset width so that it has a light blocking function but is prevented from being recognized as a code pattern by the position input device 20. For example, the light blocking pattern DP may be formed to have the same width as the width of the front surfaces of the plurality of driving electrodes TE, the plurality of sensing electrodes RE, and the plurality of dummy electrodes DE so that it is not recognized as a code pattern while lowering the reflectivity for the plurality of driving electrodes TE, the plurality of sensing electrodes RE, and the plurality of dummy electrodes DE. In this case, the width of the light blocking pattern DP may be preset and formed differently depending on an environment where it is used, such as the external brightness of the display device 10, the infrared intensity of the position input device 20, a wavelength band, and the like. Alternatively, in an embodiment, each of the position code patterns CP is formed to have a width greater than that of the light blocking pattern DP, and may be recognized as the position code pattern CP by the position input device 20 while ensuring a light blocking rate higher than that of the light blocking pattern DP.

On the other hand, a plurality of light blocking patterns DP may be arranged and formed in a straight or curved shape of a preset length, or may be arranged and formed in an open loop shape that is bent to partially surround at least one emission area. However, the light blocking pattern DP may be formed to cover the entire front surface of the plurality of dummy electrodes DE, the plurality of driving electrodes TE, and the plurality of sensing electrodes RE in order to increase the overall light blocking function. In this case, the light blocking pattern DP may have an overall shape of a mesh structure and a net structure in a plan view.

Figure 9:
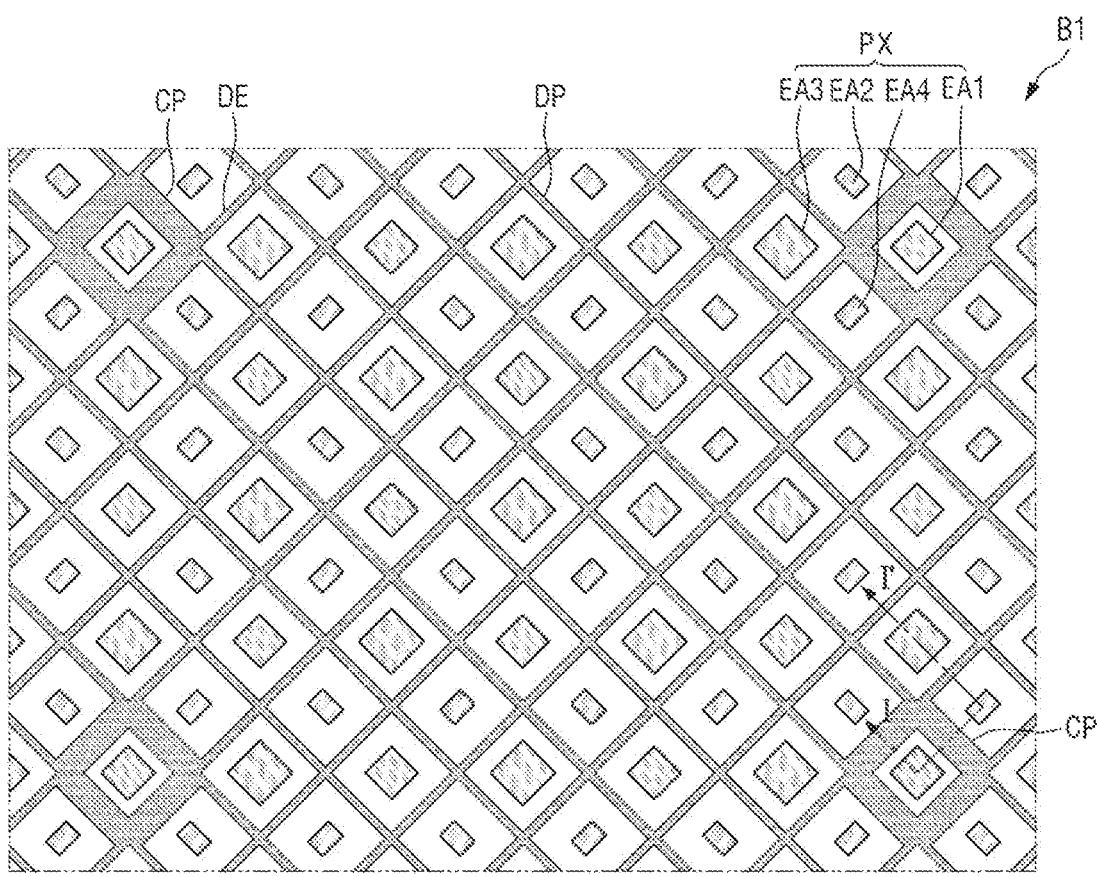
FIG. 9 is an enlarged view illustrating position code patterns and a light blocking pattern of area B1 shown in FIG. 6.
Figure 9:
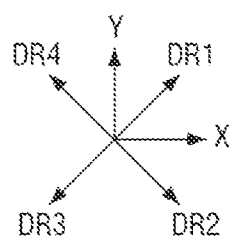

FIG. 9 is an enlarged view illustrating position code patterns and a light blocking pattern of area B1 shown in FIG. 6.

Referring to FIG. 9, the position code patterns CP may also be formed at preset intervals of about 300 µm on the front surfaces of the dummy electrodes DE as well as the driving electrodes TE and the sensing electrodes RE. Further, the light blocking pattern DP is formed on partial front surfaces of the electrodes DE, TE, and RE on which the position code patterns CP are not formed or on the entire front surface thereof.

The width in at least one direction of the position code patterns CP, the size thereof, and the length in at least one direction thereof may be set and formed to correspond to the size, sensing area, arrangement, or the like of the light receiving unit 21(b) or the optical image sensor included in the code detector 21 of the position input device 20. In an embodiment, the position code patterns CP are formed to have a width greater than the width of the neighboring light blocking pattern DP by a preset width or more, so that the position code patterns CP are darker and have a higher light blocking rate compared to the neighboring light blocking pattern DP. Accordingly, the code detector 21 of the position input device 20 may sense the code shape of the position code patterns CP by recognizing the width, size, shape, and length of the position code patterns CP with a clearer contrast compared to the neighboring light blocking pattern DP.

The planar code pattern shape of the position code patterns CP may have at least one polygonal pattern shape selected among a rectangular shape, a square shape, a circular shape, a semicircular shape, a fan shape, and a rhombus shape, or may be a pattern shape in which a plurality of polygonal pattern shapes are combined. For example, referring to FIG. 9, the planar code pattern shape of the position code patterns CP may be a rhombus pattern shape surrounding at least one emission area. In this embodiment, the width or size in at least one of the X-axis and Y-axis directions and the first to fourth directions DR1 to DR4 of the position code patterns CP is greater than the width or size in the X-axis and Y-axis directions and the first to fourth directions DR1 and DR4 of the light blocking pattern DP. FIG. 9 illustrates an example in which the width in the first to fourth directions DR1 to DR4 of the position code patterns CP is greater than the width in the first to fourth directions DR1 to DR4 of the light blocking pattern DP.

In this manner, the planar code pattern shape of the position code patterns CP may be a closed loop pattern shape such as a rectangle, a square, a rhombus, a pentagon, a hexagon, or the like which surrounds at least one emission area.

The light blocking pattern DP may be formed in a mesh structure of a preset size depending on the shape of the electrodes DE, TE, and RE in the other areas except the area where the position code patterns CP are formed. In other words, the light blocking pattern DP may be formed to surround the spaces between the emission areas EA1, EA2, EA3, and EA4 and the outer sides thereof, and thus may have an overall planar shape of a mesh structure. The light blocking pattern DP of the mesh structure should not be recognized as a code shape by the code detector 21 because a larger amount of infrared rays is reflected from the light blocking pattern DP than from the position code patterns CP and infrared rays of a higher intensity are reflected from the light blocking pattern DP than from the position code patterns CP.

Figure 10:
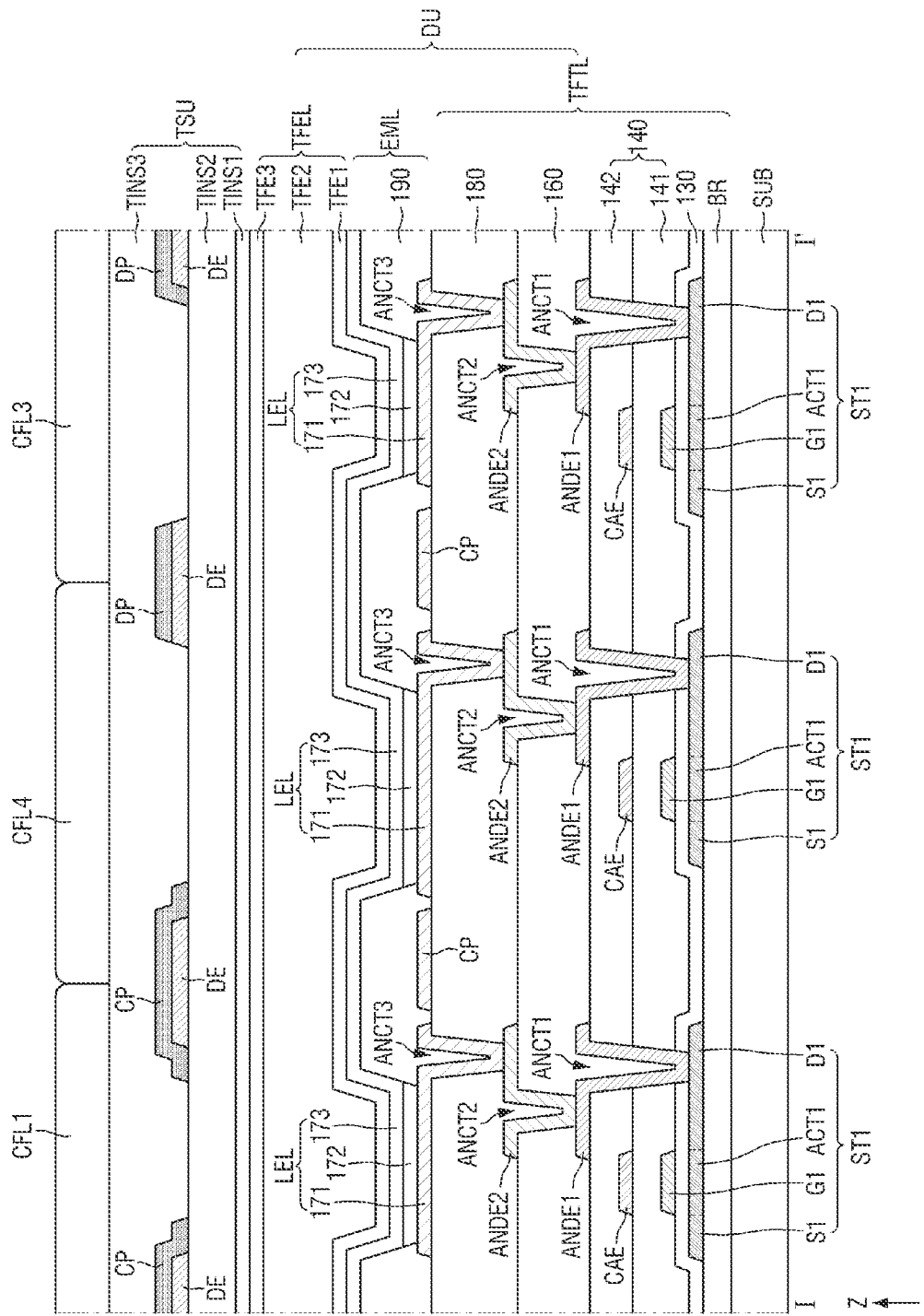
FIG. 10 is a cross-sectional view illustrating a cross-sectional structure taken along line I-I' of FIG. 9 according to an embodiment.
Figure 11:
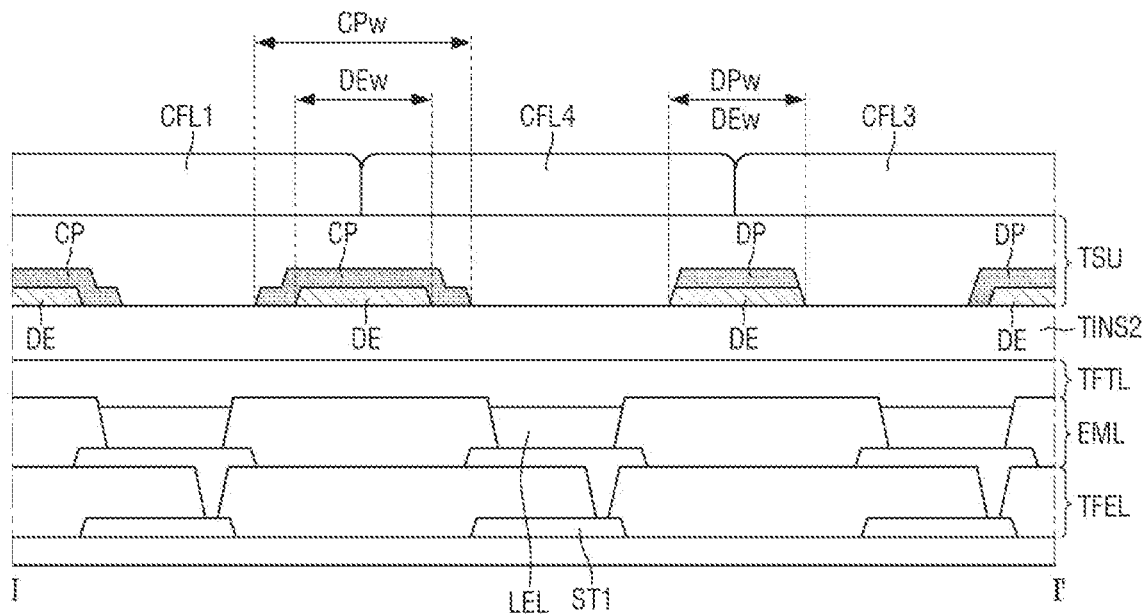
FIG. 11 is a cross-sectional view schematically showing the cross-sectional structure taken along line I-I' of FIG. 10.

FIG. 10 is a cross-sectional view illustrating a cross-sectional structure taken along line I-I' of FIG. 9 according to one embodiment. FIG. 11 is a cross-sectional view schematically showing the cross-sectional structure taken along line I-I' of FIG. 10.

Referring to FIGS. 10 and 11, a barrier layer BR may be disposed on the substrate SUB. The substrate SUB may be formed of an insulating material such as a polymer resin. For example, the substrate SUB may be formed of polyimide. The substrate SUB may be a flexible substrate which can be bent, folded or rolled.

The barrier layer BR is a layer for protecting transistors of the thin film transistor layer TFTL and a light emitting layer 172 of the light emitting element layer EML from moisture permeating through the substrate SUB which is susceptible to moisture permeation. The barrier layer BR may be formed as a plurality of inorganic layers that are alternately stacked. For example, the barrier layer BR may be formed of multiple layers in which one or more inorganic layers of a silicon nitride layer, a silicon oxynitride layer, a silicon oxide layer, a titanium oxide layer and an aluminum oxide layer are alternately stacked.

Thin film transistors ST1 may be disposed on the barrier layer BR. Each thin film transistor ST1 includes an active layer ACT1, a gate electrode G1, a source electrode S1, and a drain electrode Dl.

The active layer ACT1, the source electrode 51, and the drain electrode D1 of the thin film transistors ST1 may be disposed on the barrier layer BR. The active layer ACT1 of the thin film transistor ST1 may include polycrystalline silicon, monocrystalline silicon, low-temperature polycrystalline silicon, amorphous silicon, or an oxide semiconductor. The active layer ACT1 overlapping the gate electrode G1 in the third direction (Z-axis direction) that is the thickness direction of the substrate SUB may be defined as a channel region. The source electrode S1 and the drain electrode D1 that do not overlap the gate electrode G1 in the third direction (Z-axis direction) may have conductivity by doping a silicon semiconductor or an oxide semiconductor with ions or impurities.

A gate insulating layer 130 may be disposed on the active layer ACT1, the source electrode S1, and the drain electrode D1 of the thin film transistor ST1. The gate insulating layer 130 may be formed of an inorganic layer, for example, a silicon nitride layer, a silicon oxynitride layer, a silicon oxide layer, a titanium oxide layer, or an aluminum oxide layer.

A gate electrode G1 of the thin film transistor ST1 may be arranged on the gate insulating layer 130. The gate electrode G1 may overlap the active layer ACT1 in the third direction (Z-axis direction). The gate electrode G1 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The first interlayer insulating layer 141 may be disposed on the gate electrode G1 of the thin film transistor ST1. The first interlayer insulating layer 141 may be formed of an inorganic layer, for example, a silicon nitride layer, a silicon oxynitride layer, a silicon oxide layer, a titanium oxide layer, or an aluminum oxide layer. The first interlayer insulating layer 141 may be formed of a plurality of inorganic layers.

A capacitor electrode CAE may be disposed on the first interlayer insulating layer 141. The capacitor electrode CAE may overlap the gate electrode G1 of the first thin film transistor ST1 in the third direction (Z-axis direction). Since the first interlayer insulating layer 141 has a predetermined dielectric constant, the capacitor electrode CAE, the gate electrode G1, and the first interlayer insulating layer 141 disposed therebetween may form a capacitor. The capacitor electrode CAE may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

A second interlayer insulating layer 142 may be disposed on the capacitor electrode CAE. The second interlayer insulating layer 142 may be formed of an inorganic layer, for example, a silicon nitride layer, a silicon oxynitride layer, a silicon oxide layer, a titanium oxide layer, or an aluminum oxide layer. The second interlayer insulating layer 142 may be formed of a plurality of inorganic layers.

A first anode connection electrode ANDE1 may be disposed on the second interlayer insulating layer 142. The first anode connection electrode ANDE1 may be connected to the drain electrode D1 of the thin film transistor ST1 through a first connection contact hole ANCT1 penetrating the gate insulating layer 130, the first interlayer insulating layer 141, and the second interlayer insulating layer 142. The first anode connection electrode ANDE1 may be formed as a single layer or multiple layers made of any one of molybdenum (Mo), aluminum (Al), chromium (Cr), gold (Au), titanium (Ti), nickel (Ni), neodymium (Nd) and copper (Cu), or an alloy thereof.

A first planarization layer 160 for flattening a stepped portion formed by the thin film transistor ST1 may be disposed on the first anode connection electrode ANDE1. The first planarization layer 160 may be formed of an organic layer such as acryl resin, epoxy resin, phenolic resin, polyamide resin, polyimide resin and the like.

A second anode connection electrode ANDE2 may be disposed on the first planarization layer 160. The second anode connection electrode ANDE2 may be connected to the first anode connection electrode ANDE1 through a second connection contact hole ANCT2 penetrating the first planarization layer 160. The second anode connection electrode ANDE2 may be formed as a single layer or multiple layers made of any one of molybdenum (Mo), aluminum (Al), chromium (Cr), gold (Au), titanium (Ti), nickel (Ni), neodymium (Nd) and copper (Cu), or an alloy thereof.

A second planarization layer 180 may be disposed on the second anode connection electrode ANDE2. The second planarization layer 180 may be formed of an organic layer such as acryl resin, epoxy resin, phenolic resin, polyamide resin, polyimide resin and the like.

Light emitting elements LEL and a bank 190 may be disposed on the second planarization layer 180. Each of the light emitting elements LEL includes a pixel electrode 171, a light emitting layer 172, and a common electrode 173.

The pixel electrode 171 may be disposed on the second planarization layer 180. The pixel electrode 171 may be connected to a second anode connection electrode ANDE2 through a third connection contact hole ANCT3 penetrating the second planarization layer 180.

In a top emission structure in which light is emitted toward the common electrode 173 when viewed with respect to the light emitting layer 172, the pixel electrode 171 may be formed of a metal material having high reflectivity to have a stacked structure (Ti/Al/Ti) of aluminum and titanium, a stacked structure (ITO/Al/ITO) of aluminum and indium tin oxide (ITO), an APC alloy, and a stacked structure (ITO/APC/ITO) of an APC alloy and ITO. The APC alloy is an alloy of silver (Ag), palladium (Pd) and copper (Cu).

The bank 190 may be formed to partition the pixel electrode 171 on the second planarization layer 180 to define the first to third emission areas EA1 to EA3. The bank 190 may be disposed to cover the edge of the pixel electrode 171. The bank 190 may be formed of an organic layer such as acryl resin, epoxy resin, phenolic resin, polyamide resin, polyimide resin and the like.

Each of the first to third emission areas EA1 to EA3 represents an area in which the pixel electrode 171, the light emitting layer 172, and the common electrode 173 are sequentially stacked, and holes from the pixel electrode 171 and electrons from the common electrode 173 are combined with each other in the light emitting layer 172 to emit light.

The light emitting layer 172 may be disposed on the pixel electrode 171 and the bank 190. The light emitting layer 172 may include an organic material to emit light in a predetermined color. For example, the light emitting layer 172 includes a hole transporting layer, an organic material layer, and an electron transporting layer.

The common electrode 173 may be disposed on the light emitting layer 172. The common electrode 173 may be disposed to cover the light emitting layer 172. The common electrode 173 may be a common layer commonly formed in the first emission area EA1, the second emission area EA2, and the third emission area EA3. A capping layer may be formed on the common electrode 173.

In the top emission structure, the common electrode 173 may be formed of a transparent conductive material (TCO) such as ITO or IZO capable of transmitting light or a semi-transmissive conductive material such as magnesium (Mg), silver (Ag), or an alloy of magnesium (Mg) and silver (Ag). When the common electrode 173 is formed of a semi-transmissive conductive material, the light emission efficiency can be increased due to a micro-cavity effect.

The encapsulation layer TFEL may be disposed on the common electrode 173. The encapsulation layer TFEL includes at least one inorganic layer to prevent oxygen or moisture from permeating into the light emitting element layer EML. In addition, the encapsulation layer TFEL includes at least one organic layer to protect the light emitting element layer EML from foreign substances such as dust. For example, the encapsulation layer TFEL includes a first encapsulation inorganic layer TFE1, an encapsulation organic layer TFE2, and a second encapsulation inorganic layer TFE3.

The first encapsulation inorganic layer TFE1 may be disposed on the common electrode 173, the encapsulation organic layer TFE2 may be disposed on the first encapsulation inorganic layer TFE1, and the second encapsulation inorganic layer TFE3 may be disposed on the encapsulation organic layer TFE2. The first inorganic encapsulation layer TFE1 and the second inorganic encapsulation layer TFE3 may be formed of multiple layers in which one or more inorganic layers of a silicon nitride layer, a silicon oxynitride layer, a silicon oxide layer, a titanium oxide layer and an aluminum oxide layer are alternately stacked. The encapsulation organic layer TFE2 may be an organic layer such as acryl resin, epoxy resin, phenolic resin, polyamide resin, polyimide resin or the like.

The touch sensing unit TSU may be disposed on the encapsulation layer TFEL. In an embodiment, the touch sensing unit TSU includes a first touch insulating layer TINS1, the connection electrode CE, a second touch insulating layer TINS2, the driving electrode TE, the sensing electrode RE, and a third touch insulating layer TINS3.

The first touch insulating layer TINS1 may be formed of an inorganic layer, for example, a silicon nitride layer, a silicon oxynitride layer, a silicon oxide layer, a titanium oxide layer, or an aluminum oxide layer.

The connection electrode CE may be disposed on the first touch insulating layer TINS1. The connection electrode CE may be formed as a single layer or multiple layers made of any one of molybdenum (Mo), aluminum (Al), chromium (Cr), gold (Au), titanium (Ti), nickel (Ni), neodymium (Nd) and copper (Cu), or an alloy thereof.

The second touch insulating layer TINS2 is disposed on the first touch insulating layer TINS1 including the connection electrodes CE. The second touch insulating layer TINS2 may be formed of an inorganic layer, for example, a silicon nitride layer, a silicon oxynitride layer, a silicon oxide layer, a titanium oxide layer, or an aluminum oxide layer. Alternatively, the second touch insulating layer TINS2 may be formed of an organic layer such as acryl resin, epoxy resin, phenolic resin, polyamide resin, polyimide resin and the like.

The driving electrodes TE and the sensing electrodes RE may be disposed on the second touch insulating layer TINS2. Further, the dummy electrodes DE, the first touch driving lines TL1, the second touch driving lines TL2, and the touch sensing lines RL shown in FIG. 4 as well as the driving electrodes TE and the sensing electrodes RE may be arranged on the second touch insulating layer TINS2.

The driving electrodes TE, the sensing electrodes RE, and the dummy electrodes DE are formed of a conductive metal electrode, and the conductive metal electrode may be made of any one of molybdenum (Mo), aluminum (Al), chromium (Cr), gold (Au), titanium (Ti), nickel (Ni), neodymium (Nd), and copper (Cu) or an alloy thereof. The driving electrodes TE, the sensing electrodes RE, and the dummy electrodes DE are formed in a mesh structure or a mesh structure so as not to overlap the emission areas EA1 to EA4. The driving electrode TE and the sensing electrode RE may partially overlap the connection electrode CE in the third direction (Z-axis direction). The driving electrode TE may be connected to the connection electrode CE through a touch contact hole penetrating the second touch insulating layer TINS2.

A light blocking member is coated on the entire surface of the second touch insulating layer TINS2 including the driving electrodes TE, the sensing electrodes RE, and the dummy electrodes DE. Then, the coated light blocking member is patterned in the shape of the driving electrodes TE, the sensing electrodes RE, and the dummy electrodes DE and in a preset planar code shape. Specifically, the light blocking member may be formed in the position code patterns CP and the light blocking pattern DP by performing exposure and patterning processes using a mask. In this manner, the position code patterns CP and the light blocking pattern DP are simultaneously formed on the front surfaces of the driving electrodes TE, the sensing electrodes RE, and the dummy electrodes DE by the patterning process.

In an embodiment, a width DPw or size of the light blocking pattern DP formed to correspond to the transmitting portion or the semi-transmitting portion of the mask used in the patterning process is the same as a width DEw or size of the driving electrodes TE, the sensing electrodes RE, and the dummy electrodes DE. Further, in an embodiment, a width CPw or size of the position code patterns CP formed to correspond to the transmitting portion or the semi-transmitting portion of the mask used in the patterning process is greater than the width DEw or size of the driving electrodes TE, the sensing electrodes RE, and the dummy electrode DE. Accordingly, the width CPw or size of the position code patterns CP may be greater than the width DPw or size of the light blocking pattern DP.

When the position code patterns CP are formed using the semi-transmitting portion of the half tone mask, an inclined surface of a predetermined angle may be formed on the front sides of the position code patterns CP. When the inclined surfaces are formed on the front sides of the position code patterns CP, infrared light may be diffusely reflected to further lower the infrared light reflectivity of the position code patterns CP.

In an embodiment, the light blocking member formed of the position code patterns CP and the light blocking pattern DP is made of a material including a material that absorbs infrared rays or ultraviolet rays. For example, the light blocking member may be made of a material including an inorganic or organic pigment. Here, the inorganic pigment may be a pigment containing at least any one compound selected among carbon black, a cyanine-based compound, a polymethine-based compound, an anthraquinone-based compound, and a phthalocyanine-based compound. On the other hand, the organic pigment may include at least one of lactam black, perylene black, or aniline black, but the present disclosure is not limited thereto.

The third touch insulating layer TINS3 is formed on the driving electrodes TE and the sensing electrodes RE including the position code patterns CP and the light blocking pattern DP. The third touch insulating layer TINS3 may serve to flatten the stepped portion formed by the driving electrodes TE, the sensing electrodes RE, and the connection electrodes CE. In an embodiment, the third touch insulating layer TINS3 is formed of an inorganic layer, that is, a silicon nitride layer, a silicon oxynitride layer, a silicon oxide layer, a titanium oxide layer, or an aluminum oxide layer. Alternatively, the third touch insulating layer TINS3 may be formed of an organic layer such as acryl resin, epoxy resin, phenolic resin, polyamide resin, polyimide resin and the like.

A plurality of color filter layers CFL1, CFL3, and CFL4 may be formed on the touch sensing unit TSU. For example, the plurality of color filter layers CFL1, CFL3, and CFL4 may be disposed on the third touch insulating layer TINS3 to be located on the same plane.

Figure 12:
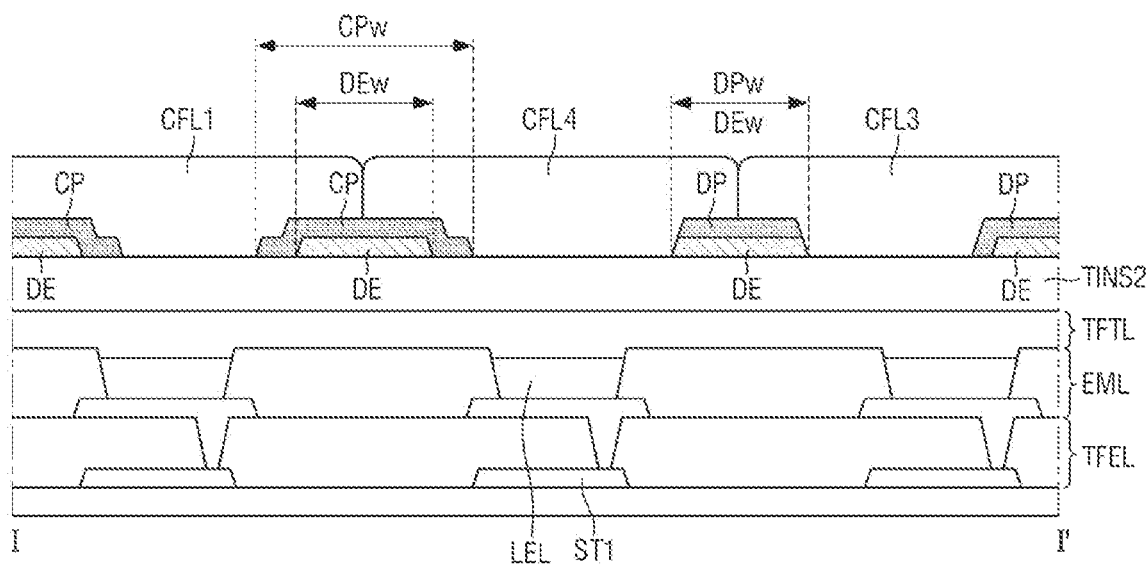
FIG. 12 is a cross-sectional view illustrating a cross-sectional structure taken along line I-I' of FIG. 9 according to an embodiment.

FIG. 12 is a cross-sectional view specifically illustrating a cross-sectional structure taken along line I-I' of FIG. 9 according to an embodiment.

Referring to FIG. 12, the plurality of color filter layers CFL1, CFL3, and CFL4 may be formed on the touch sensing unit TSU, but the plurality of color filter layers CFL1, CFL3, and CFL4 may be formed on the second touch insulating layer TINS2 while covering the position code patterns CP and the light blocking pattern DP. For example, while the color filter layers CFL1, CFL3, and CFL4 are shown in FIG. 11 as being disposed contacting the touch sensing unit TSU, in the embodiment shown in FIG. 12, the color filter layers CFL1, CFL3, and CFL4 may contact the second touch insulating layer TINS2.

In other words, the plurality of color filter layers CFL1, CFL3, and CFL4 may be formed on the second touch insulating layers TINS2 while covering the position code patterns CP and the light blocking pattern DP as well as the first to fourth emission areas EA1, EA2, EA3 and EA4. Here, a first color filter CFL1 may be disposed on the first emission area EA1 emitting light of the first color, the second color filter (not shown) may be disposed on the second emission area EA2 emitting light of the second color, and the third color filter CFL3 may be disposed on the third emission area EA3 emitting light of the third color. Further, a second color filter may also be disposed on the fourth emission area emitting light of the second color.

On the other hand, on the first to fourth emission areas EA1, EA2, EA3, and EA4 as well as the position code patterns CP and the light blocking pattern DP, a separate polarizing film may be formed instead of the plurality of color filter layers CFL1, CFL3, and CFL4.

Figure 13:
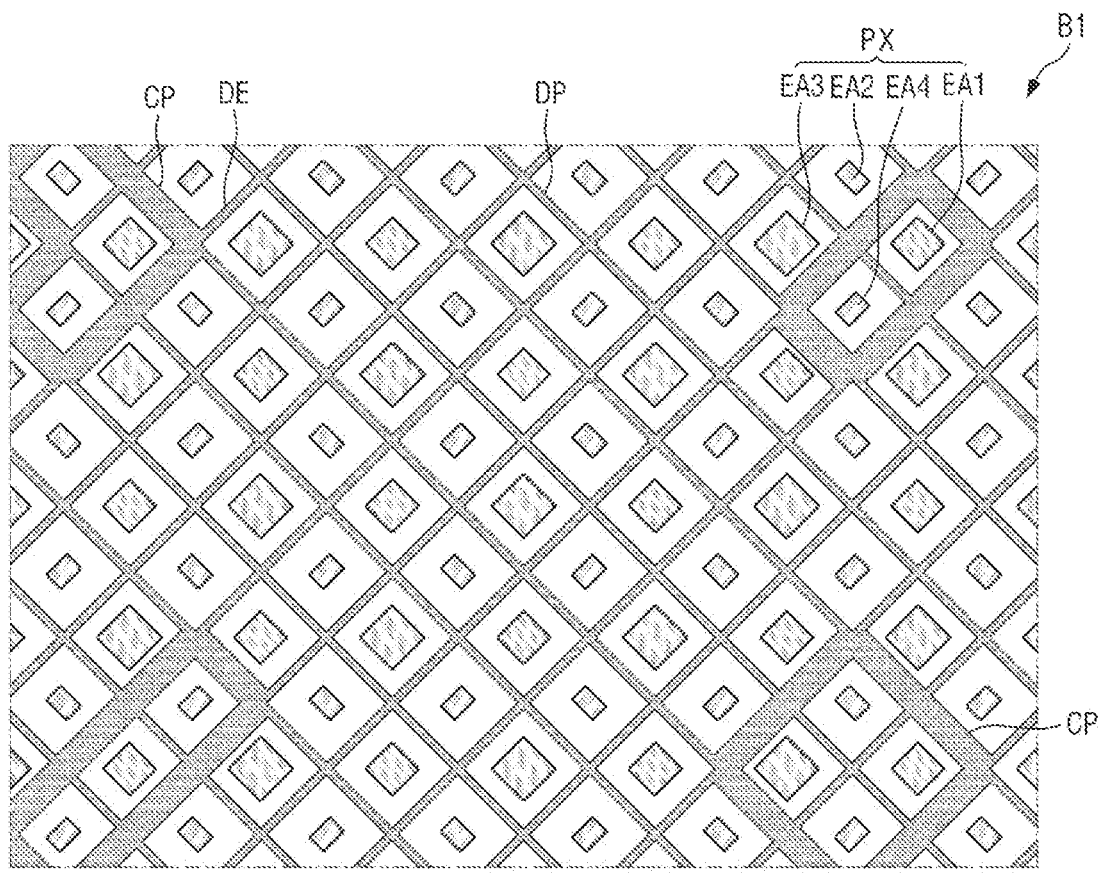
FIG. 13 is an enlarged view illustrating area B1 in which position code patterns and a light blocking pattern according to a an embodiment are disposed.
Figure 13:
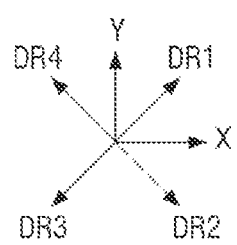

FIG. 13 is an enlarged view illustrating area B1 in which position code patterns and a light blocking pattern according to an embodiment are disposed.

Referring to FIG. 13, the position code patterns CP are formed at preset intervals on the front surfaces of the dummy electrodes DE as well as the driving electrodes TE and the sensing electrodes RE. Further, the light blocking pattern DP is formed on partial front surfaces of the electrodes DE, TE, and RE on which the position code patterns CP are not formed or on the entire front surface thereof.

The planar code shape of the position code patterns CP may be at least one polygonal closed loop pattern shape such as a rectangular pattern, a square pattern, a rhombus pattern, a pentagonal pattern, a hexagonal pattern, or the like which surrounds at least one of the emission areas EA1, EA2, EA3, and EA4. In an embodiment, at least one of an area of each of the position code patterns CP, a width in at least one direction thereof, a length in at least one direction thereof, and a size in at least one direction thereof may be different from those of other adjacent position code patterns CP. In an embodiment, at least of the area, the width, and the size of each of the position code patterns CP are different to form different shapes so that their corresponding positions can be distinguished from one another.

Further, the width in at least one direction of the position code patterns CP, the size thereof, and the length in at least one direction thereof may be set and formed to correspond to the size, sensing area, arrangement or the like of the light receiving unit 21(b) or the optical image sensor included in the code detector 21 of the position input device 20. In an embodiment, the width or size in at least one of the X-axis and Y-axis directions and the first to fourth directions DR1 to DR4 of the position code patterns CP is greater than the width or size in the X-axis and Y-axis directions and the first to fourth directions DR1 to DR4 of the light blocking pattern DP. FIG. 13 illustrates an example in which the width in the first to fourth directions DR1 to DR4 of the position code patterns CP is greater than the width in the first to fourth directions DR1 to DR4 of the light blocking pattern DP.

In this manner, the position code patterns CP are formed to have a width greater than the width of the neighboring light blocking pattern DP by a preset width or more, so that the position code patterns CP are darker and have a higher light blocking rate compared to the neighboring light blocking pattern DP. Accordingly, the code detector 21 of the position input device 20 may sense the code shape of the position code patterns CP by recognizing the width, size, shape, and length of the position code patterns CP with a clearer contrast compared to the neighboring light blocking pattern DP.

Figure 14:
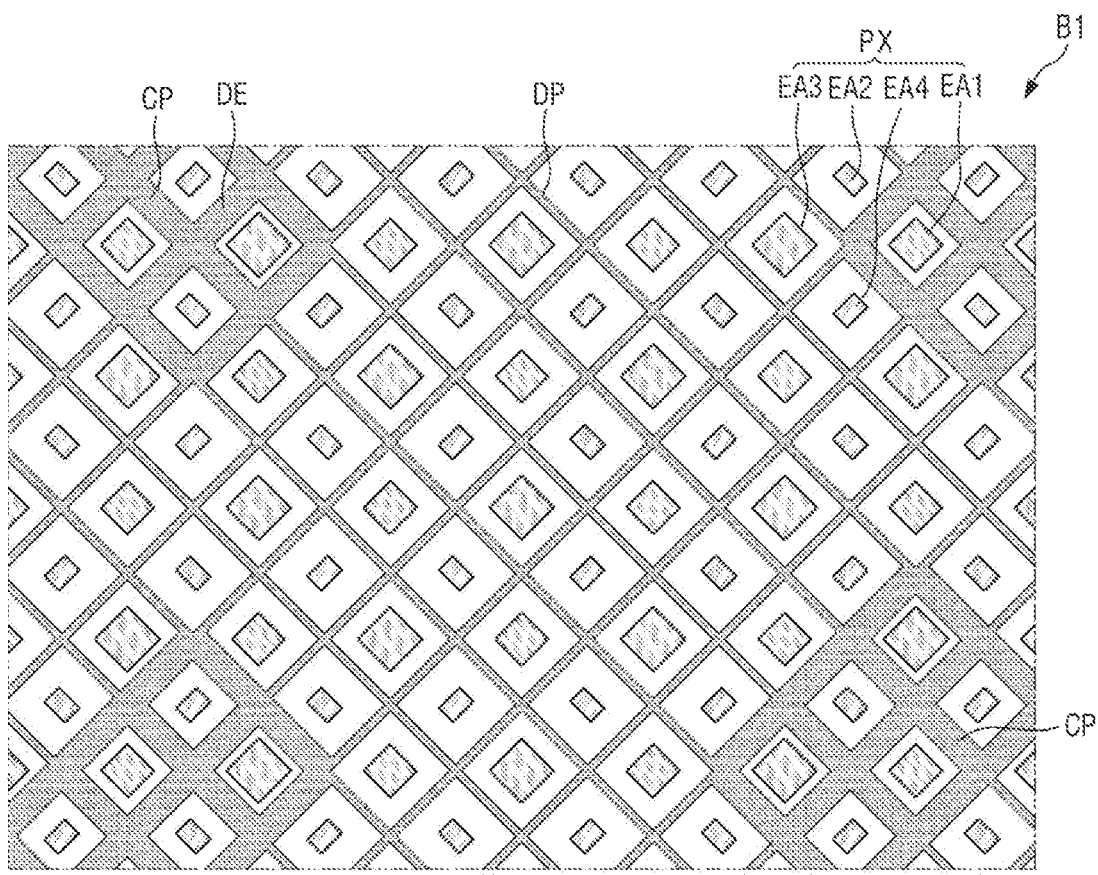
FIG. 14 is an enlarged view illustrating area B1 in which position code patterns and a light blocking pattern according to an embodiment are disposed.
Figure 14:
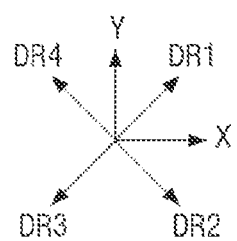

FIG. 14 is an enlarged view illustrating area B1 in which position code patterns and a light blocking pattern according to an embodiment are disposed.

Referring to FIG. 14, the position code patterns CP may be formed in a mesh pattern shape in a plan view while surrounding the spaces between the plurality of emission areas EA1, EA2, EA3, and EA4 formed in the position code forming area and the outer sides thereof. In an embodiment, at least one of an area of each of the position code patterns CP, a width in at least one direction thereof, a length in at least one direction thereof, and an overall size in at least one direction thereof may be different from those of other adjacent position code patterns CP.

Further, in an embodiment, the width or size in at least one of the X-axis and Y-axis directions and the first to fourth directions DR1 to DR4 of the position code patterns CP is greater than the width or size in the X-axis and Y-axis directions and the first to fourth directions DR1 to DR4 of the light blocking pattern DP.

The position code patterns CP are formed to have a width greater than the width of the neighboring light blocking pattern DP by a preset width or more, so that the position code patterns CP are darker and have a higher light blocking rate compared to the neighboring light blocking pattern DP. Accordingly, the code detector 21 of the position input device 20 may sense the code shape of the position code patterns CP by recognizing the width, size, shape, and length of the position code patterns CP with a clearer contrast compared to the neighboring light blocking pattern DP.

The light blocking pattern DP may also be formed in a mesh structure of a preset size depending on the shape of the electrodes DE, TE, RE in the other areas except the area where the position code patterns CP are formed. In other words, the light blocking pattern DP may be formed to surround the spaces between the emission areas EA1, EA2, EA3, and EA4, and the outer sides thereof, and thus may have an overall planar shape of a mesh structure. The light blocking pattern DP of the mesh structure should not be recognized as a code shape by the code detector 21 because a larger amount of infrared rays is reflected from the light blocking pattern DP than from the position code patterns CP and infrared rays of a higher intensity are reflected from the light blocking pattern DP than from the position code patterns CP.

Figure 15:
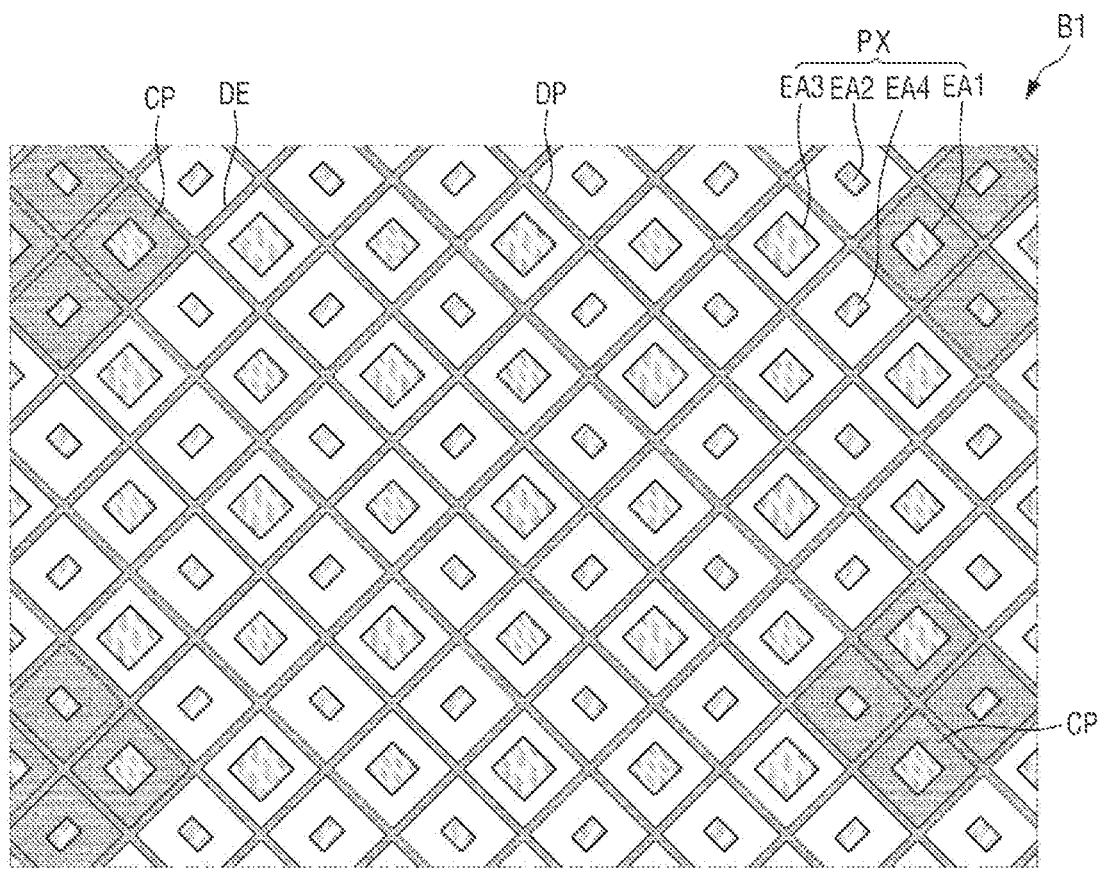
FIG. 15 is an enlarged view specifically illustrating area B1 in which position code patterns and a light blocking pattern according to an embodiment are disposed.

FIG. 15 is an enlarged view illustrating area B1 in which position code patterns and a light blocking pattern according to an embodiment are disposed.

Referring to FIG. 15, the position code patterns CP may be formed in a mesh pattern shape or a net pattern shape in a plan view while surrounding the spaces between the plurality of emission areas EA1, EA2, EA3, and EA4 and the outer sides thereof. In this embodiment, the position code patterns CP are formed by further covering some of adjacent emission areas as well as the front surface and side surfaces of at least one of the plurality of driving electrodes TE, the plurality of sensing electrodes RE, and the plurality of dummy electrodes DE.

Since the position code patterns CP are formed by further covering some of the plurality of emission areas EA1, EA2, EA3 and EA4 formed in the position code forming area, the area of the emission areas EA1, EA2, EA3, and EA4 in which the position code patterns CP are formed and a light output amount may be reduced.

Accordingly, the emission areas EA1, EA2, EA3, and EA4 formed in the position code forming area and the position code patterns CP are darker and have a higher light blocking rate compared to the neighboring light blocking patterns DP. Accordingly, the code detector 21 of the position input device 20 may sense the code shape of the position code patterns CP by recognizing the emission areas EA1, EA2, EA3, and EA4 and the position code patterns CP with a clearer contrast compared to the neighboring light blocking pattern DP.

Figure 16:
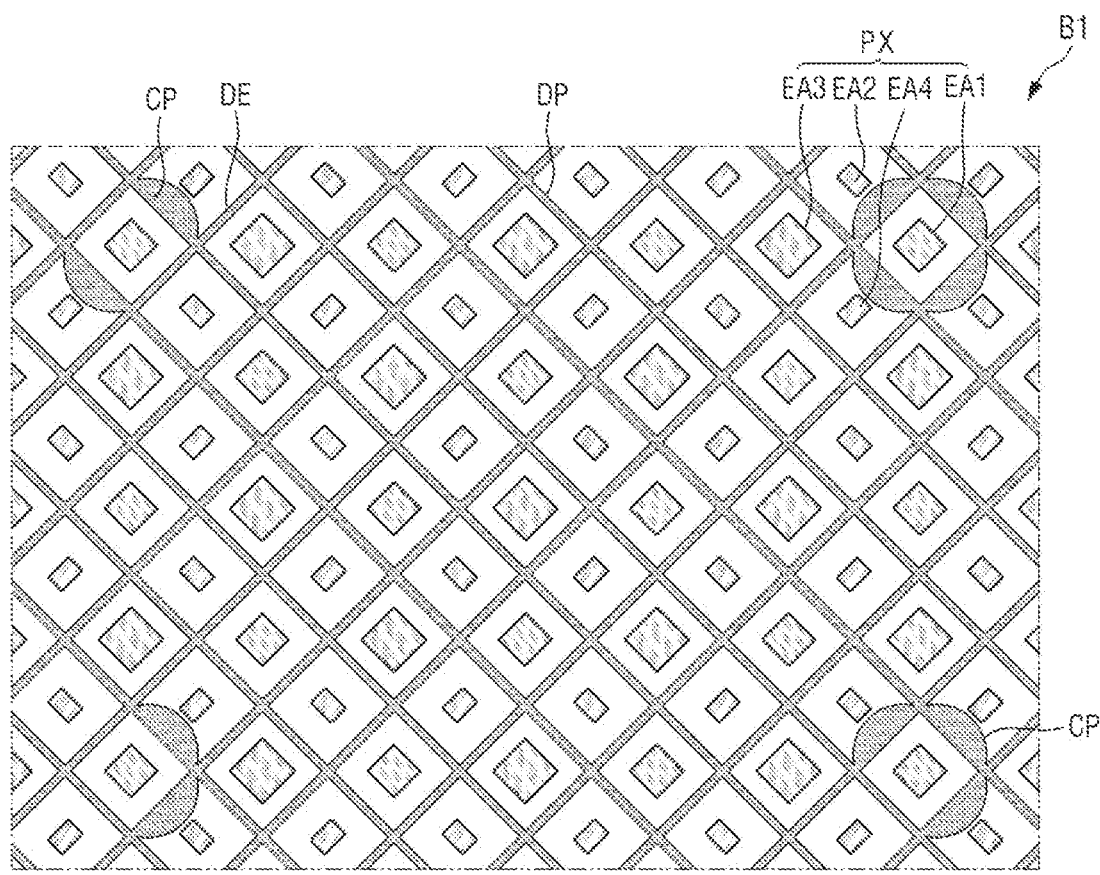
FIG. 16 is an enlarged view specifically illustrating area B1 in which position code patterns and a light blocking pattern according to an embodiment are disposed.
Figure 16:
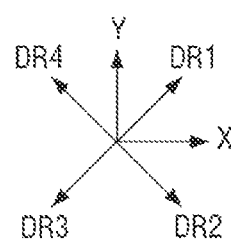

FIG. 16 is an enlarged view illustrating area B1 in which position code patterns and a light blocking pattern according to an embodiment are disposed.

Referring to FIG. 16, the position code patterns CP may be formed in at least one pattern shape selected among a fan-shaped pattern shape, a semicircular pattern shape, and a circular pattern shape between the plurality of adjacent emission areas EA1, EA2, EA3 and EA4, or may be formed in a pattern shape in which the fan-shaped pattern shape, the semicircular pattern shape, and the circular pattern shape are in contact with each other and combined. In this embodiment, an area of each of the position code patterns CP, a width in at least one direction thereof, a length in at least one direction thereof, or a size in at least one direction thereof may be different from those of other adjacent position code patterns CP. For example, a position code pattern CP may include four semicircular pattern shapes connected together as shown in the upper right corner, include three semicircular pattern shapes connected together as shown in the lower right corner, include two semicircular pattern shapes connected together as shown in the lower left corner, or include two or more semicircular pattern shapes not connected to one another as shown in the upper left corner.

In particular, the width in at least one direction of the position code patterns CP, the size thereof, and the length in at least one direction thereof may be set and formed to correspond to the size, sensing area, arrangement or the like of the light receiving unit 21(*b*) or the optical image sensor included in the code detector 21 of the position input device 20.

Figure 17:
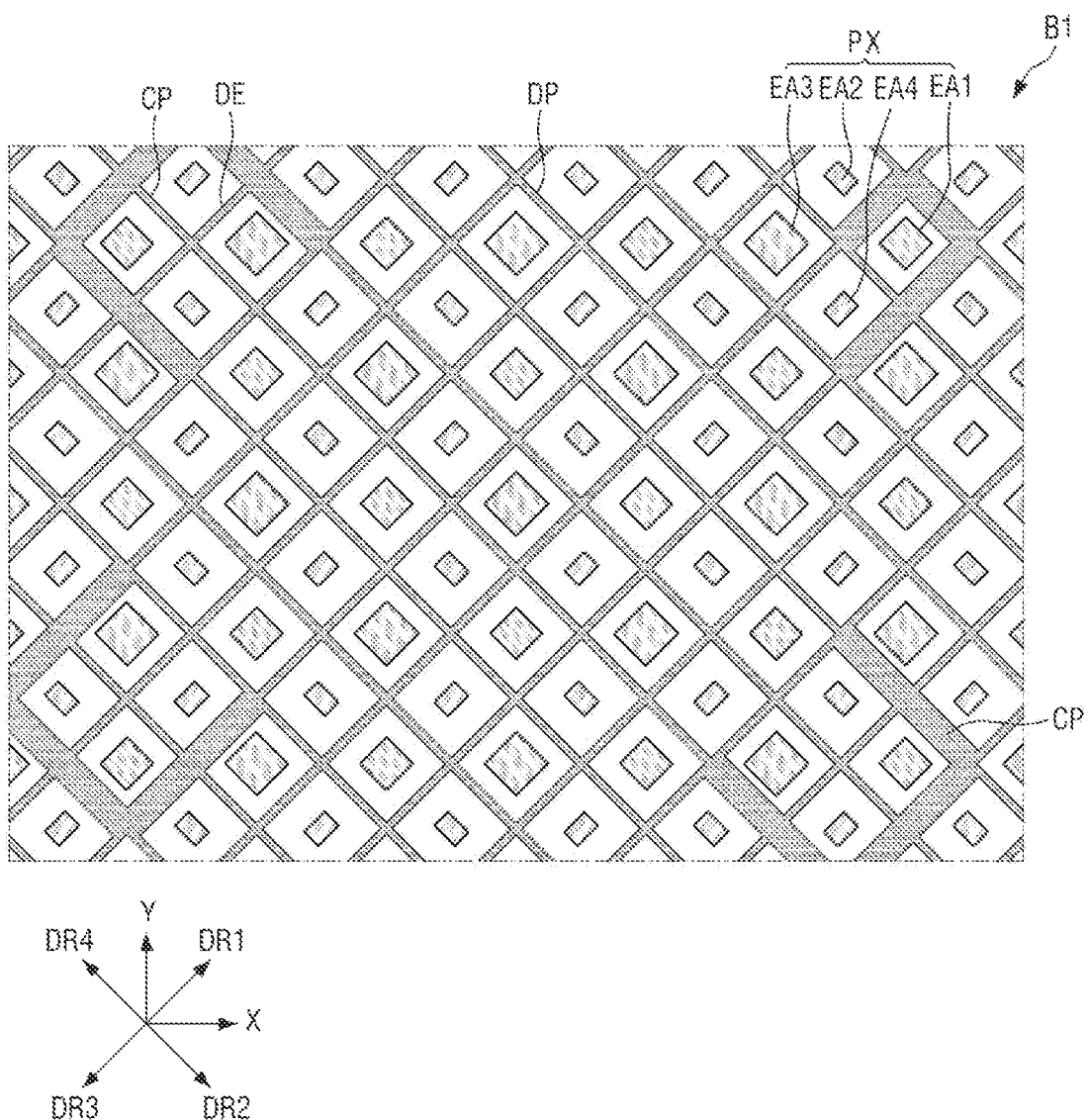
FIG. 17 is an enlarged view specifically illustrating area B1 in which position code patterns and a light blocking pattern according to an embodiment are disposed.

FIG. 17 is an enlarged view illustrating area B1 in which position code patterns and a light blocking pattern according to an embodiment are disposed.

Referring to FIG. 17, the position code patterns CP are formed at preset intervals on the front surfaces of the dummy electrodes DE as well as the driving electrodes TE and the sensing electrodes RE, and the light blocking pattern DP is formed on partial front surfaces of the electrodes DE, TE, and RE where the position code patterns CP are formed or on the entire front surface thereof.

The planar code shape of the position code patterns CP may be an open loop shape partially surrounding the outer sides of the at least one of the emission areas EA1, EA2, EA3, and EA4.

In an embodiment, the width or size in at least one of the X-axis and Y-axis directions and the first to fourth directions DR1 to DR4 of the position code patterns CP is greater than the width or size in the X-axis and Y-axis directions and the first to fourth directions DR1 to DR4 of the light blocking pattern DP.

The position code patterns CP are formed to have a width greater than the width of the neighboring light blocking pattern DP by a preset width or more, so that the position code patterns CP are darker and have a higher light blocking rate compared to the neighboring light blocking pattern DP. Accordingly, the code detector 21 of the position input device 20 may sense the code shape of the position code patterns CP by recognizing the width, size, shape, and length of the position code patterns CP with a clearer contrast compared to the neighboring light blocking pattern DP.

Accordingly, the position input device 20 may continuously generate the shape data of the position code patterns CP depending on the amount and type of infrared light emitted from the display unit DU and reflected from the display unit DU. Further, the position input device 20 may identify the structure and shape of the position code patterns CP and extract a data code corresponding to the structure and shape of the position code patterns CP. In this manner, the position input device 20 may combine the extracted data codes, and generate and transmit position coordinate data corresponding to the combined data code.

Figure 18:
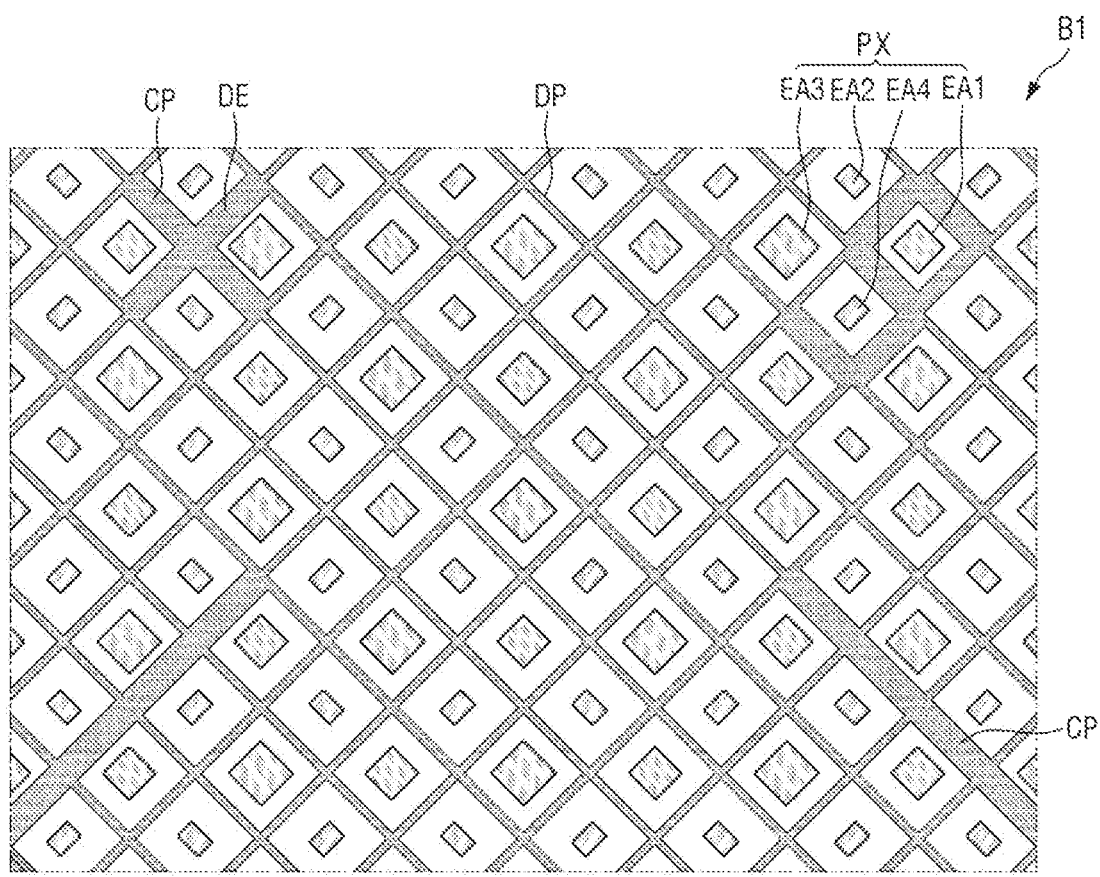
FIG. 18 is an enlarged view specifically illustrating area B1 in which position code patterns and a light blocking pattern according to an embodiment are disposed.

FIG. 18 is an enlarged view illustrating area B1 in which position code patterns and a light blocking pattern according to an embodiment are disposed.

Referring to FIG. 18, the planar code shape of the position code patterns CP may be at least one pattern shape selected among a straight (e.g., a line) or curved shape of a preset length, a cross pattern shape (e.g., an 'x'), and an irregular polygonal pattern shape having a predetermined curvature (e.g., an 's').

In an embodiment, at least one of an area of each of the position code patterns CP, a width in at least one direction thereof, a length in at least one direction thereof, and a size in at least one direction thereof are different from those of the other position code patterns CP.

The position code patterns CP are formed to have a width greater than the width of the neighboring light blocking pattern DP by a preset width or more, so that the position code patterns CP are darker and have a higher light blocking rate compared to the neighboring light blocking pattern DP. Accordingly, the code detector 21 of the position input device 20 may sense the code shape of the position code patterns CP by recognizing the width, size, shape, and length of the position code patterns CP with a clearer contrast compared to the neighboring light blocking pattern DP.

Figure 19:
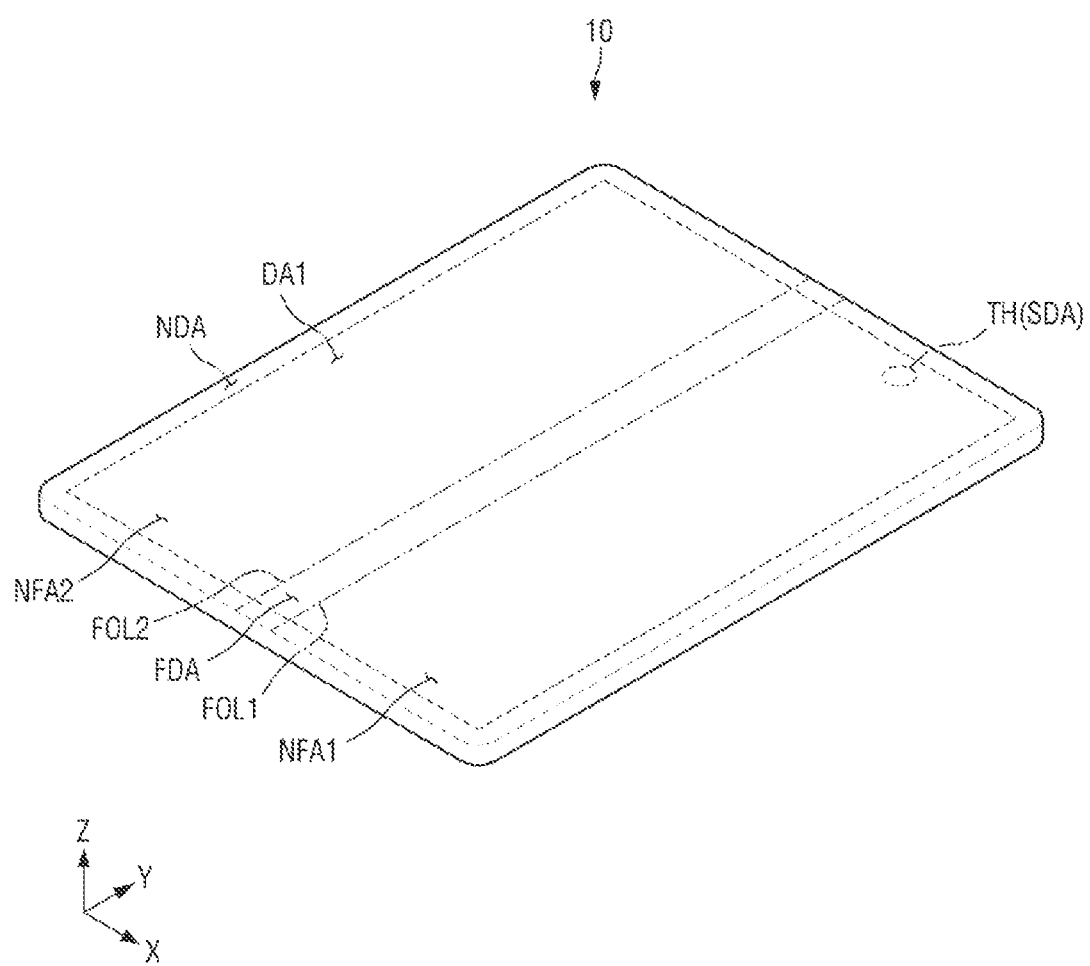
FIGS. 19 and 20 are perspective views illustrating a display device according to an embodiment of the present disclosure.
Figure 20:
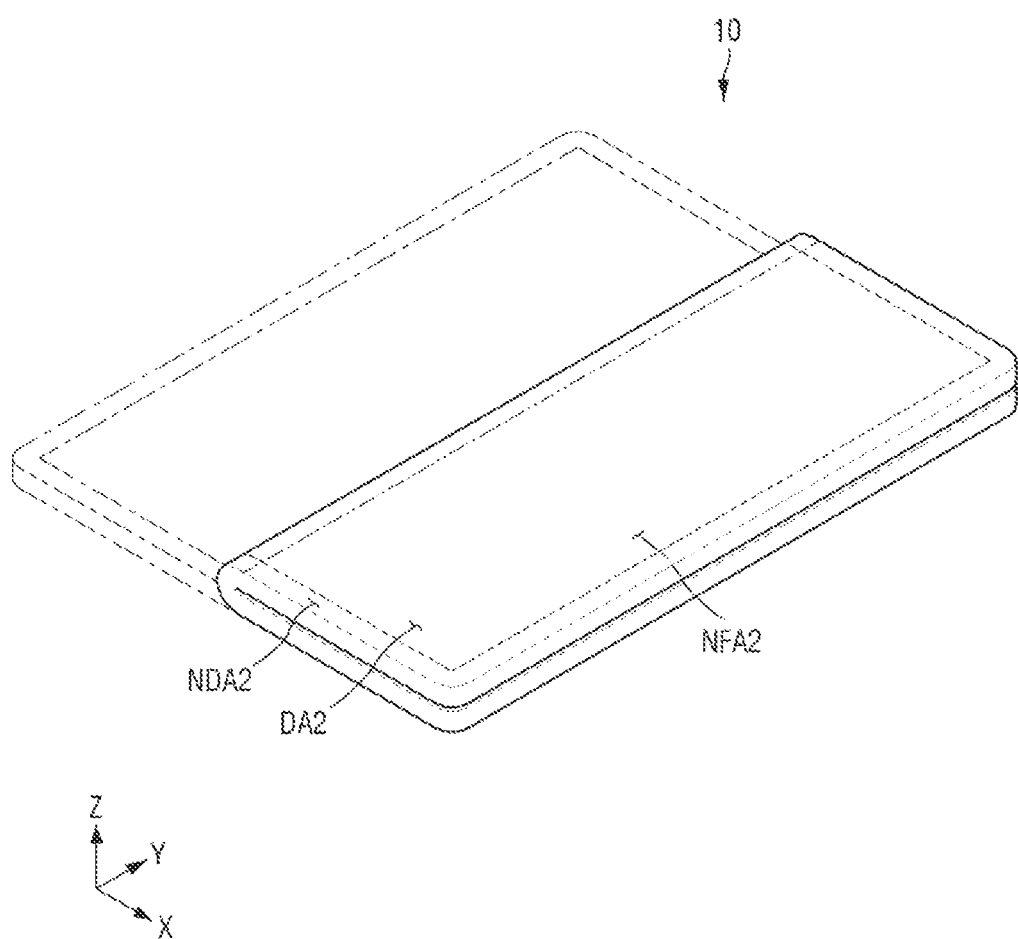

FIGS. 19 and 20 are perspective views illustrating a display device according to an embodiment of the present disclosure.

FIGS. 19 and 20 illustrate the display device 10 as a foldable display device that is folded in the first direction (X-axis direction). The display device 10 may maintain both a folded state and an unfolded state. The display device 10 may be folded in an in-folding manner in which the front surface is disposed on the inside thereof. When the display device 10 is bent or folded in the in-folding manner, the front surfaces of the display device 10 may be disposed to face each other. Alternatively, the display device 10 may be folded in an out-folding manner in which the front surface is disposed on the outside thereof. When the display device 10 is bent or folded in an out-folding manner, the rear surfaces of the display device 10 may be disposed to face each other.

A first non-folding area NFA1 may be disposed on one side, for example, the right side of a folding area FDA. A second non-folding area NFA2 may be disposed on the other side, for example, the left side of the folding area FDA. The touch sensing unit TSU according to the embodiment of this specification may be formed and disposed on the first non-folding area NFA1 and the second non-folding area NFA2.

A first folding line FOL1 and a second folding line FOL2 extend in the second direction (Y-axis direction), and the display device 10 may be folded in the first direction (X-axis direction). Accordingly, the length of the display device 10 in the first direction (X-axis direction) may be reduced to approximately half, so that a user can conveniently carry the display device 10.

Meanwhile, the extension direction of the first folding line FOL1 and the extension direction of the second folding line FOL2 are not limited to the second direction (Y-axis direction). For example, the first folding line FOL1 and the second folding line FOL2 may extend in the first direction (X-axis direction), and the display device 10 may be folded in the second direction (Y-axis direction). In this case, the length of the display device 10 in the second direction (Y-axis direction) may be reduced to approximately half. Alternatively, the first folding line FOL1 and the second folding line FOL2 may extend in the diagonal direction of the display device 10 between the first direction (X-axis direction) and the second direction (Y-axis direction). In this case, the display device 10 may be folded in a triangular shape.

When the first folding line FOL1 and the second folding line FOL2 extend in the second direction (Y-axis direction), the length of the folding area FDA in the first direction (X-axis direction) may be shorter than the length thereof in the second direction (Y-axis direction). Further, the length of the first non-folding area NFA1 in the first direction (X-axis direction) may be longer than the length of the folding area FDA in the first direction (X-axis direction). The length of the second non-folding area NFA2 in the first direction (X-axis direction) may be longer than the length of the folding area FDA in the first direction (X-axis direction).

The first display area DA1 may be disposed on the front surface of the display device 10. The first display area DA1 may overlap the folding area FDA, the first non-folding area NFA1, and the second non-folding area NFA2. Therefore, when the display device 10 is unfolded, an image may be displayed toward the front side thereof in the folding area FDA, the first non-folding area NFA1, and the second non-folding area NFA2 of the display device 10.

The second display area DA2 may be disposed on the rear surface of the display device 10. The second display area DA2 may overlap the second non-folding area NFA2. Therefore, when the display device 10 is folded, an image may be displayed toward the front side thereof in the second non-folding area NFA2 of the display device 10.

FIGS. 19 and 20 illustrate that a through hole TH in which the camera SDA or the like is formed is disposed in the first non-folding area NFA1, but the present disclosure is not limited thereto. The through hole TH or the camera SDA may be disposed in the second non-folding area NFA2 or the folding area FDA.

Figure 21:
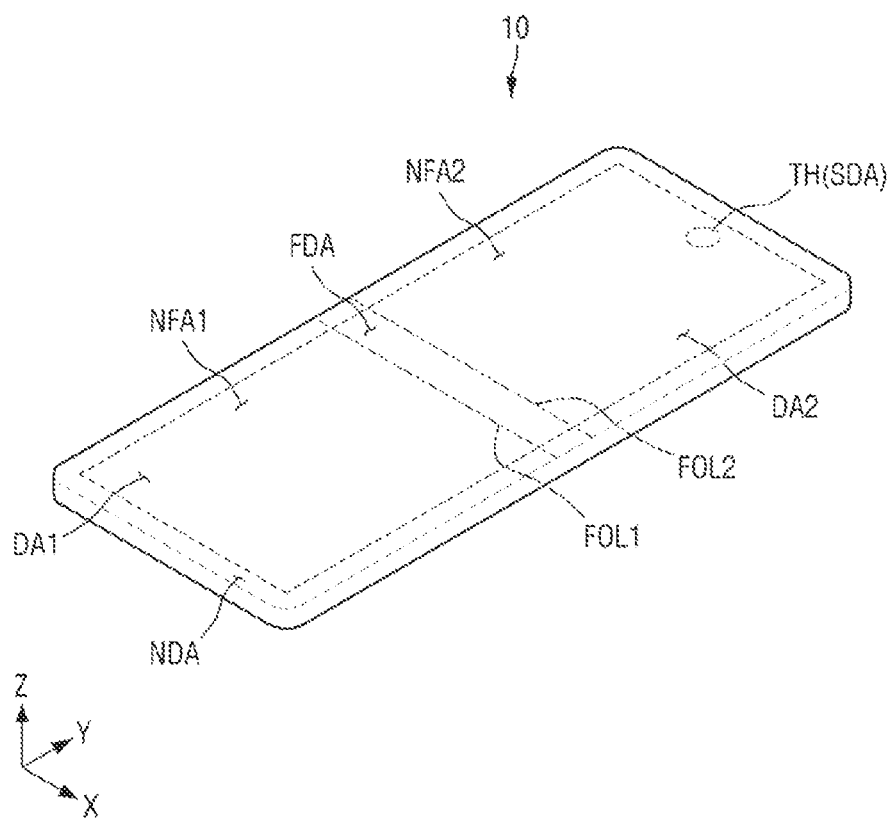
FIGS. 21 and 22 are perspective views illustrating a display device according to an embodiment of the present disclosure.
Figure 22:
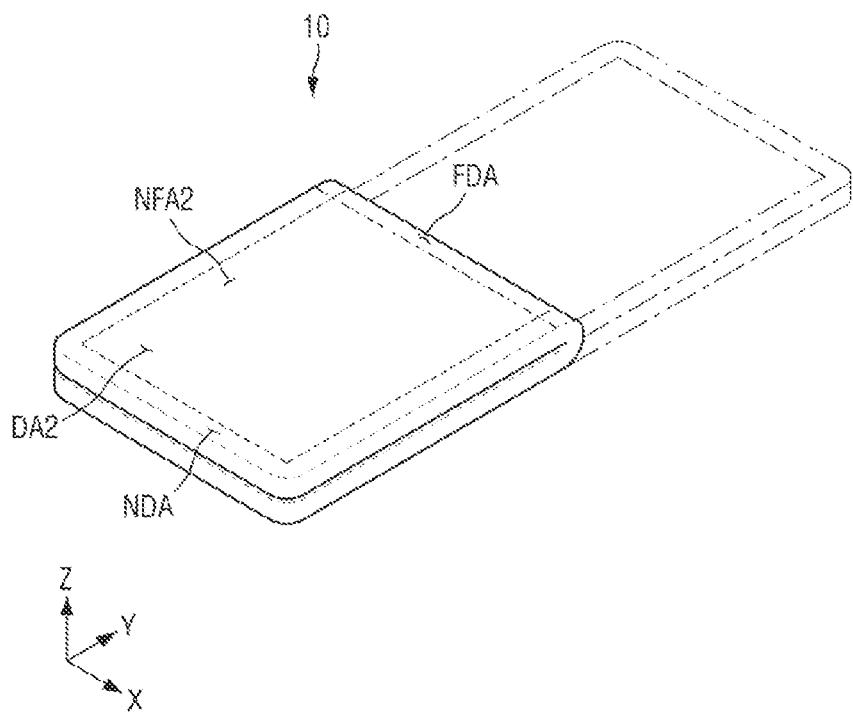

FIGS. 21 and 22 are perspective views illustrating a display device according to an embodiment of the present disclosure.

FIGS. 21 and 22 illustrate the display device 10 as a foldable display device folded in the second direction (Y-axis direction). The display device 10 may maintain both a folded state and an unfolded state. The display device 10 may be folded in an in-folding manner in which the front surface is disposed on the inside thereof. When the display device 10 is bent or folded in the in-folding manner, the front surfaces of the display device 10 may be disposed to face each other. Alternatively, the display device 10 may be folded in an out-folding manner in which the front surface is disposed on the outside thereof. When the display device 10 is bent or folded in an out-folding manner, the rear surfaces of the display device 10 may be disposed to face each other.

The display device 10 may include a folding area FDA, the first non-folding area NFA1, and the second non-folding area NFA2. The folding area FDA may be an area in which the display device 10 is folded, and the first and second non-folding areas NFA1 and NFA2 may be areas in which the display device 10 is not folded. The first non-folding area NFA1 may be disposed on one side (e.g., a lower side) of the folding area FDA. The second non-folding area NFA2 may be disposed on the other side (e.g., an upper side) of the folding area FDA.

The touch sensing unit TSU according to the embodiment of this specification may be formed and disposed on the first non-folding area NFA1 and the second non-folding area NFA2.

On the other hand, the folding area FDA may be a curved area with a predetermined curvature at a first folding line FOL1 and a second folding line FOL2. Thus, the first folding line FOL1 may be the boundary between the folding area FDA and the first non-folding area NFA1, and the second folding line FOL2 may be the boundary between the folding area FDA and the second non-folding area NFA2.

The first folding line FOL1 and the second folding line FOL2 may extend in the first direction (X-axis direction) as shown in FIGS. 21 and 22. In this case, the display device 10 may be folded in the second direction (Y-axis direction). Accordingly, the length of the display device 10 in the second direction (Y-axis direction) may be reduced to approximately half, so that a user can conveniently carry the display device 10.

Meanwhile, the extension direction of the first folding line FOL1 and the extension direction of the second folding line FOL2 are not limited to the first direction (X-axis direction). For example, the first folding line FOL1 and the second folding line FOL2 may extend in the second direction (Y-axis direction), and the display device 10 may be folded in the first direction (X-axis direction). In this case, the length of the display device 10 in the first direction (X-axis direction) may be reduced to approximately half. Alternatively, the first folding line FOL1 and the second folding line FOL2 may extend in the diagonal direction of the display device 10 between the first direction (X-axis direction) and the second direction (Y-axis direction). In this case, the display device 10 may be folded in a triangular shape.

When the first folding line FOL1 and the second folding line FOL2 extend in the first direction (X-axis direction) as shown in FIGS. 21 and 22, the length of the folding area FDA in the second direction (Y-axis direction) may be shorter than the length of the folding area FDA in the first direction (X-axis direction). Further, the length of the first non-folding area NFA1 in the second direction (Y-axis direction) may be longer than the length of the folding area FDA in the second direction (Y-axis direction). The length of the second non-folding area NFA2 in the second direction (Y-axis direction) may be longer than the length of the folding area FDA in the second direction (Y-axis direction).

The first display area DA1 may be disposed on the front surface of the display device 10. The first display area DA1 may overlap the folding area FDA, the first non-folding area NFA1, and the second non-folding area NFA2. Therefore, when the display device 10 is unfolded, an image may be displayed toward the front side thereof in the folding area FDA, the first non-folding area NFA1, and the second non-folding area NFA2 of the display device 10.

The second display area DA2 may be disposed on the rear surface of the display device 10. The second display area DA2 may overlap the second non-folding area NFA2. Therefore, when the display device 10 is folded, an image may be displayed toward the front side thereof in the second non-folding area NFA2 of the display device 10.

FIGS. 21 and 22 illustrate that the through hole TH in which the camera SDA or the like is disposed is disposed in the second non-folding area NFA2, but the present disclosure is not limited thereto. The through hole TH may be disposed in the first non-folding area NFA1 or the folding area FDA.

In an embodiment, a display device includes a pixel having a plurality of emission areas; a plurality of touch electrodes disposed between the plurality of emission areas to sense a touch; a plurality of position code patterns covering part of a surface of some of the plurality of touch electrodes at a preset interval; and a plurality of light blocking patterns covering part of a surface of others of the plurality touch electrodes not covered by the position code patterns. A width of each of the plurality of position code patterns is larger than a width of each of the light blocking patterns.

In concluding the detailed description, those skilled in the art will appreciate that many variations and modifications can be made to the embodiments without substantially departing from the principles of the present invention.

What is claimed is:

1. A display device comprising:
   a pixel comprising a plurality of emission areas;
   a plurality of touch electrodes disposed between the plurality of emission areas to sense a touch;
   a plurality of position code patterns covering a partial front surface of at least one of the plurality of touch electrodes in a preset code shape; and
   a light blocking pattern disposed on front surfaces of the plurality of touch electrodes on which the plurality of position code patterns are not formed,
   wherein a width or size of the plurality of position code patterns is greater than a width or size of the light blocking pattern.

2. The display device of claim 1, wherein the plurality of emission areas are arranged in a horizontal or vertical stripe structure or are arranged in a pentile™ matrix structure,
   the plurality of touch electrodes comprise a plurality of driving electrodes, a plurality of sensing electrodes, and a plurality of dummy electrodes, and
   the plurality of driving electrodes, the plurality of sensing electrodes, and the plurality of dummy electrodes are formed in a mesh structure surrounding spaces between all the plurality of emission areas and outer sides thereof.

3. The display device of claim 2, wherein the plurality of position code patterns and the light blocking pattern include a black pigment that absorbs infrared or ultraviolet rays, and are formed by patterning to partially cover a front surface and a side surface of at least one of the plurality of touch electrodes so as not to overlap each other.

4. The display device of claim 3, wherein the light blocking pattern is formed in a mesh shape surrounding spaces between the plurality of emission areas and outer sides thereof according to an arrangement shape of the plurality of touch electrodes, and is formed to have a width corresponding to a width of the front surfaces of the plurality of touch electrodes.

5. The display device of claim 3, wherein front sides of the plurality of position code patterns have inclined surfaces.

6. The display device of claim 2, wherein a width or size in at least one of X-axis and Y-axis directions and first to fourth directions of the plurality of position code patterns is greater than a width or size in the X-axis and Y-axis directions and the first to fourth directions of the light blocking pattern, the X-axis and Y-axis directions are vertical and horizontal directions, and the first to fourth directions are diagonal directions with respect to the X-axis and Y-axis directions.

7. The display device of claim 6, wherein a planar code pattern shape of each of the plurality of position code patterns has a polygonal pattern shape of at least one of a rectangular shape, a square shape, a circular shape, a semicircular shape, a fan shape, or a rhombus shape, or has a pattern shape in which a plurality of polygonal pattern shapes are combined.

8. The display device of claim 6, wherein a planar code pattern shape of each of the plurality of position code patterns has a polygonal closed loop pattern shape of at least one of a rectangular pattern, a square pattern, a rhombus pattern, a pentagonal pattern, or a hexagonal pattern surrounding at least one of the plurality of emission areas.

9. The display device of claim 6, wherein a planar code pattern shape of each of the plurality of position code patterns has a planar mesh pattern shape surrounding spaces between the plurality of emission areas formed in a position code forming area and outer sides thereof, covers a part of at least one adjacent emission area and cover front and side surfaces of the plurality of touch electrodes.

10. The display device of claim 6, wherein the plurality of position code patterns has at least one of a fan-shaped pattern shape, a semicircular pattern shape, or a circular pattern shape between a plurality of emission areas adjacent to each other in a position code forming area, or has a pattern shape in which the fan-shaped pattern shape, the semicircular pattern shape, and the circular pattern shape are in contact with each other and combined.

11. The display device of claim 6, wherein a planar code pattern shape of each of the plurality of position code patterns has an open loop shape partially surrounding outer sides of at least one emission area located in a position code forming area.

12. The display device of claim 6, wherein the plurality of position code patterns has at least one pattern shape selected among a straight or curved shape of a preset length, a cross pattern shape, and an irregular polygonal pattern shape having a predetermined curvature, between a plurality of emission areas adjacent to each other formed in a position code forming area.

13. The display device of claim 6, wherein an area of each of the plurality of position code patterns, a width in at least one direction thereof, a length in at least one direction thereof, and a size in at least one direction thereof are different from those of other adjacent position code patterns.

14. A position input system comprising:
a display device configured to display an image; and
a position input device configured to input position coordinate data to the display device,
wherein the display device comprises:
a pixel comprising a plurality of emission areas;
a plurality of touch electrodes disposed between the plurality of emission areas to sense a touch;
a plurality of position code patterns covering a partial front surface of at least one of the plurality of touch electrodes in a preset code shape; and
a light blocking pattern disposed on front surfaces of the plurality of touch electrodes on which the plurality of position code patterns are not formed, wherein a width or size of the plurality of position code patterns is greater than a width or size of the light blocking pattern.

15. The position input system of claim 14, wherein the position input device comprises:
a code detector configured to detect the plurality of position code patterns;
a code processor configured to receive shape data for the plurality of position code patterns, extract a data code corresponding to a shape of the plurality of position code patterns, and generate the position coordinate data corresponding to the data code; and
a communication module configured to transmit the position coordinate data to the display device.

16. The position input system of claim 14, wherein the plurality of emission areas are arranged in a horizontal or vertical stripe structure, or are arranged in a pentile™ matrix structure, the plurality of touch electrodes comprise a plurality of driving electrodes, a plurality of sensing electrodes, and a plurality of dummy electrodes, and the plurality of driving electrodes, the plurality of sensing electrodes, and the plurality of dummy electrodes are formed in a mesh structure surrounding spaces between all the plurality of emission areas and outer sides thereof.

17. The position input system of claim 16, wherein the plurality of position code patterns and the light blocking pattern include a black pigment that absorbs infrared or ultraviolet rays, and are formed by patterning to partially cover a front surface and a side surface of at least one of the plurality of touch electrodes so as not to overlap each other.

18. The position input system of claim 17, wherein the light blocking pattern has a mesh shape surrounding spaces between the plurality of emission areas and outer sides thereof according to an arrangement shape of the plurality of touch electrodes, and has a width corresponding to a width of the front surfaces of the plurality of touch electrodes.

19. The position input system of claim 16, wherein front sides of the plurality of position code patterns have included surfaces.

20. The position input system of claim 16, wherein a width or size in at least one of X-axis and Y-axis directions and first to fourth directions of the plurality of position code patterns is greater than a width or size in the X-axis and Y-axis directions and the first to fourth directions of the light blocking pattern, the X-axis and Y-axis directions are vertical and horizontal directions, and the first to fourth directions are diagonal directions with respect to the X-axis and Y-axis directions.

21. A display device comprising:
a pixel comprising a plurality of emission areas;
a plurality of touch electrodes disposed between the plurality of emission areas to sense a touch;
a plurality of position code patterns covering part of a surface of some of the plurality of touch electrodes and spaced apart from one another at a present interval; and
a plurality of light blocking patterns covering part of a surface of others of the plurality of touch electrodes not covered by the position code patterns, wherein a width of each of the plurality of position code patterns is larger than a width of each the light blocking patterns.

22. The display device of claim 21, wherein the plurality of emission areas are arranged in a stripe or in a pentile™ matrix structure.

23. The display device of claim 21, wherein the plurality of position code patterns and the light blocking patterns each include a black pigment that absorbs infrared or ultraviolet rays.

* * * * *